United States Patent

Linker, Sr. et al.

[11] Patent Number: 5,570,727
[45] Date of Patent: Nov. 5, 1996

[54] PLCC REFORMING AND RECONDITIONING SYSTEM, METHOD AND APPARATUS

[75] Inventors: Frank V. Linker, Sr., Springfield; Edward T. Claffey, Glen Mills, both of Pa.

[73] Assignee: American Tech Manufacturing Corportion, Glenolden, Pa.

[21] Appl. No.: 293,014

[22] Filed: Aug. 19, 1994

[51] Int. Cl.⁶ ...................................................... B21F 1/02
[52] U.S. Cl. ........................................... 140/105; 140/147
[58] Field of Search ................................... 140/105, 140, 140/147

[56] References Cited

U.S. PATENT DOCUMENTS

| | | | |
|---|---|---|---|
| 4,643,234 | 2/1987 | Alemanni | 140/140 |
| 4,691,747 | 9/1987 | Sokolovsky | 140/147 |
| 5,319,847 | 6/1994 | Darling et al. | 140/147 |

*Primary Examiner*—Lowell A. Larson
*Attorney, Agent, or Firm*—Eugene E. Renz, Jr.

[57] ABSTRACT

In a system, method and apparatus for reforming leads of a device having a plurality of generally straight sides and rows of leads of J-shaped configuration extending from the sides of the body portion reforming the leads of a pair of first opposing rows of leads at a first reforming station by moving combs of a lead straightening mechanism through the leads to space the leads a predetermined distance relative to one another. The leads of one row engage against reforming surfaces with the combs engaging between the J-shaped terminal ends. The device is then relocated to present a second pair of opposing rows of leads to a lead straightening mechanism. The second opposing parallel rows of leads are reformed by moving combs through the leads to space the leads a predetermined distance relative to one another by engaging the leads of one row against reforming surfaces with the combs engaging between the J-shaped terminal ends.

13 Claims, 32 Drawing Sheets

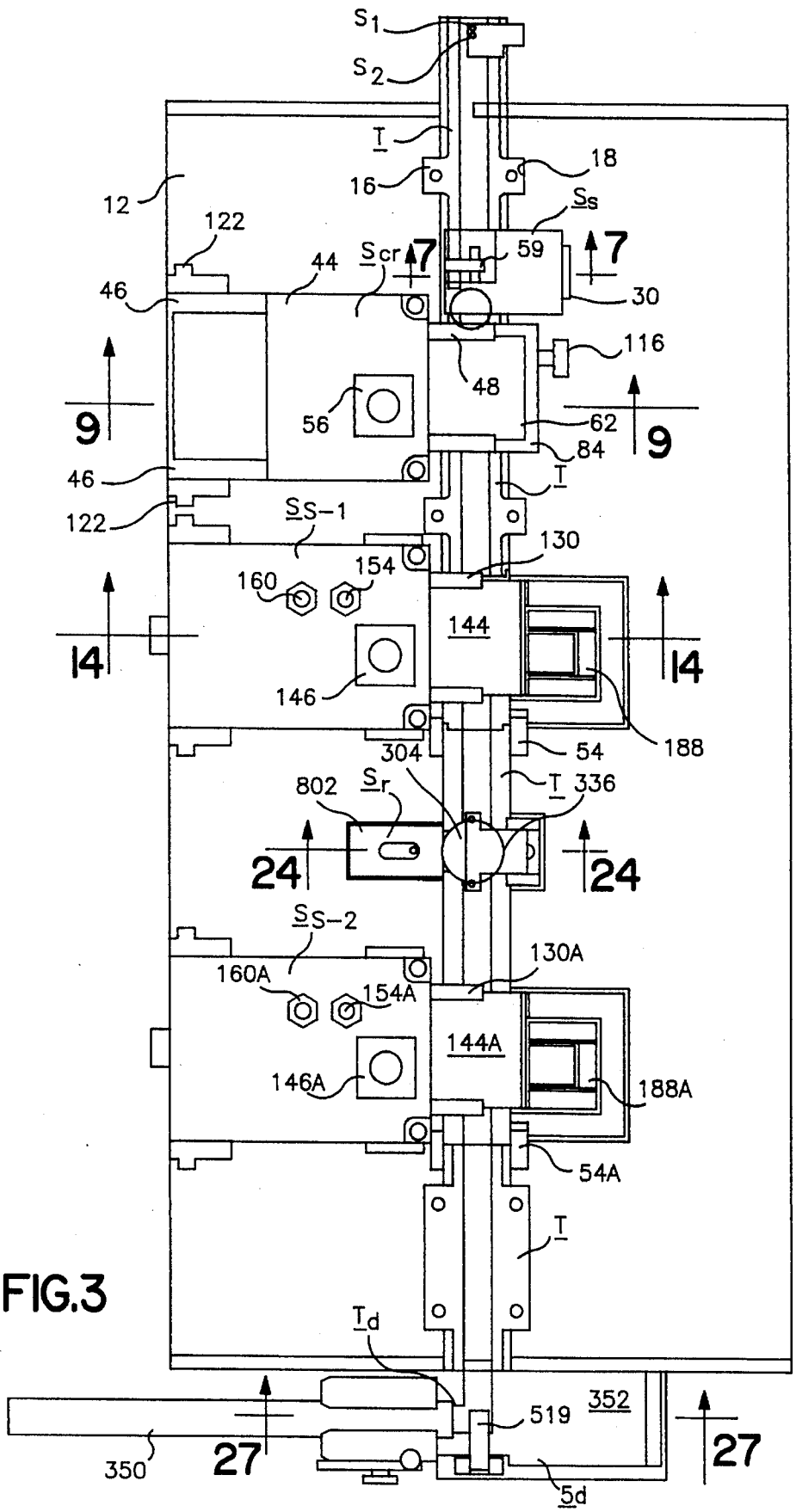

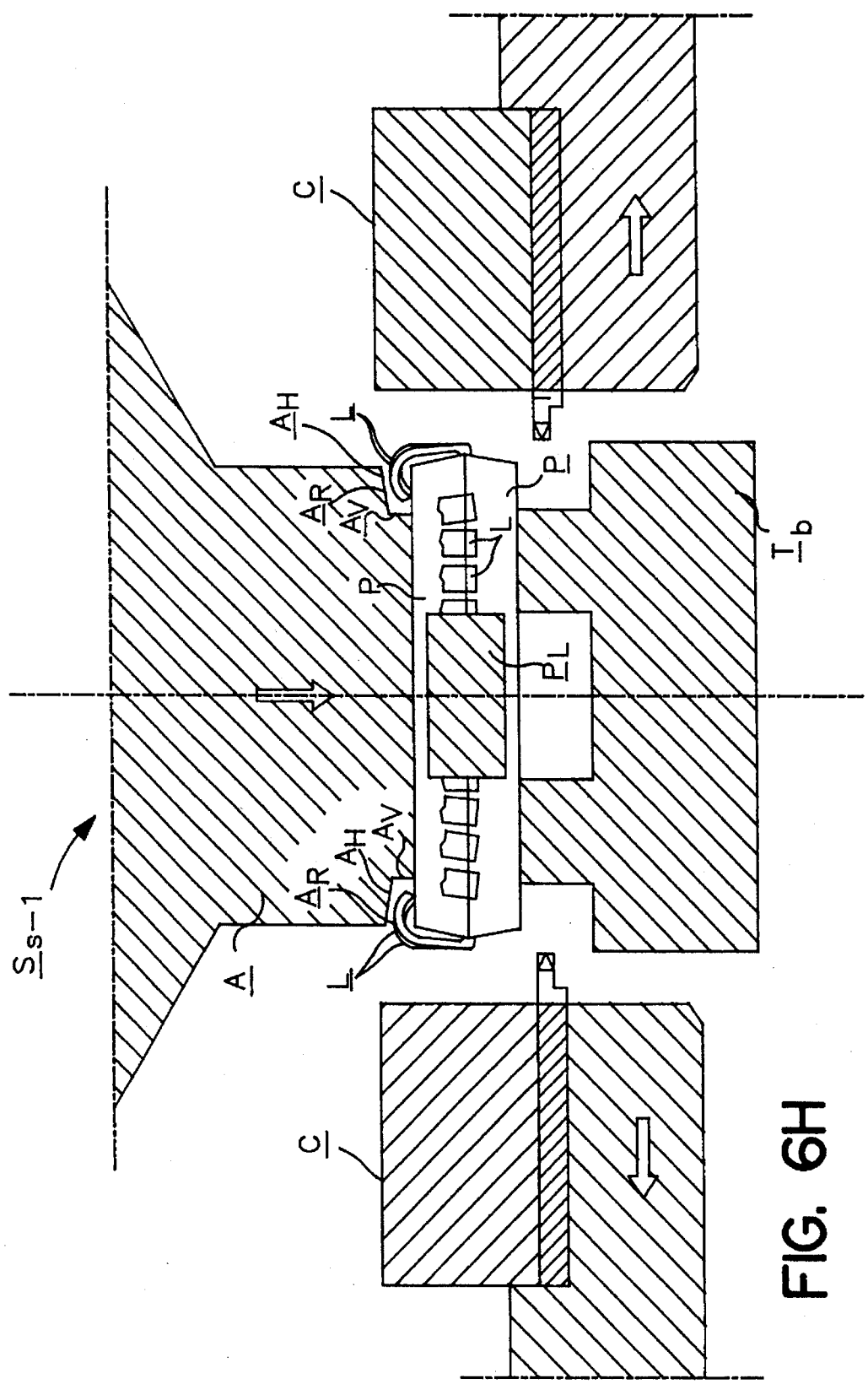

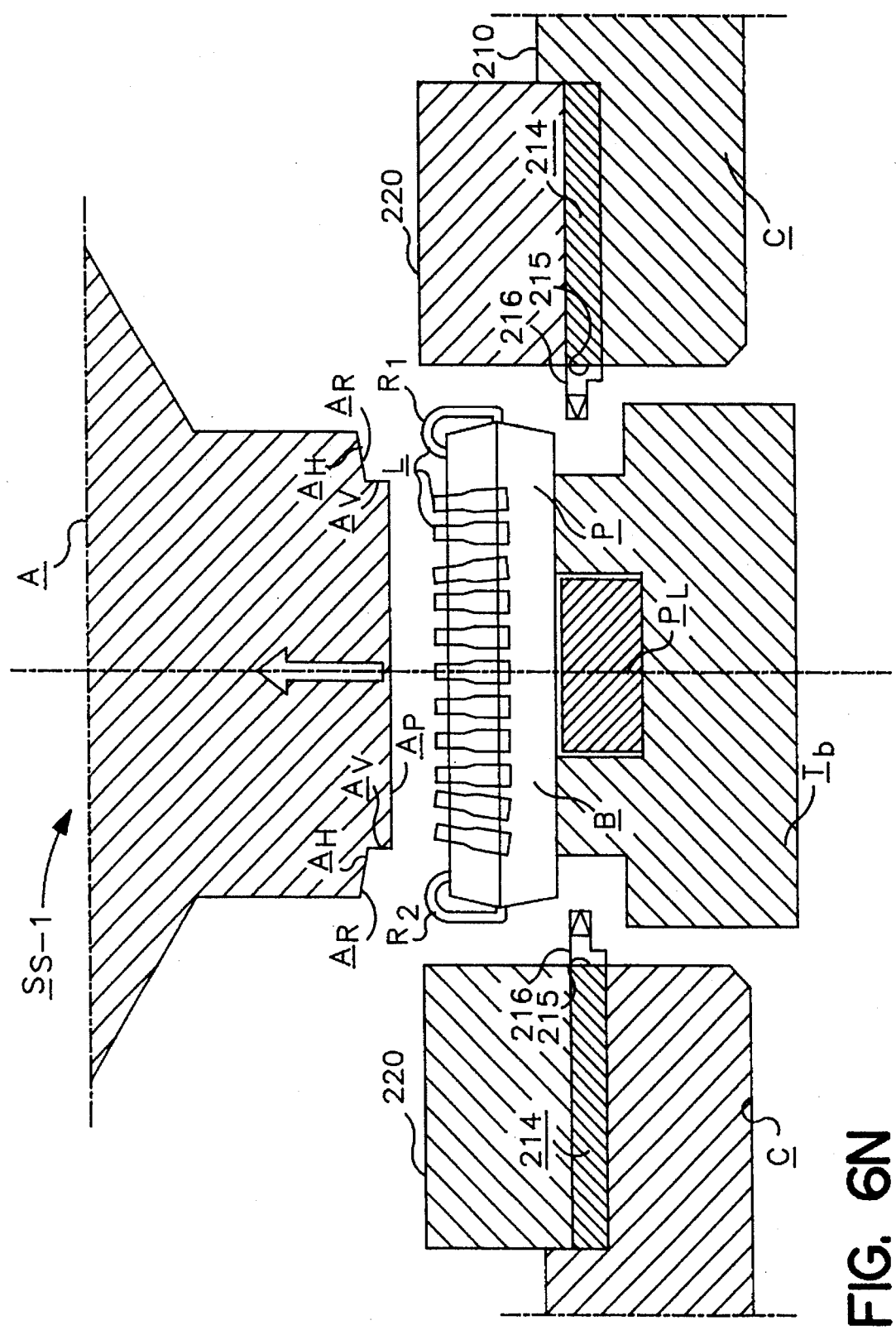

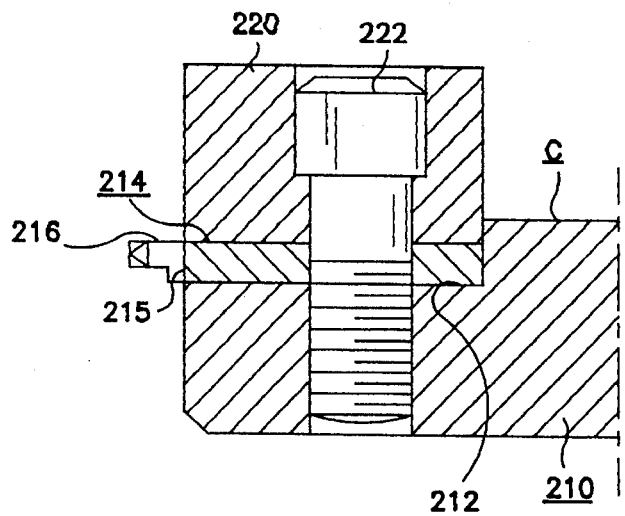
FIG. 21
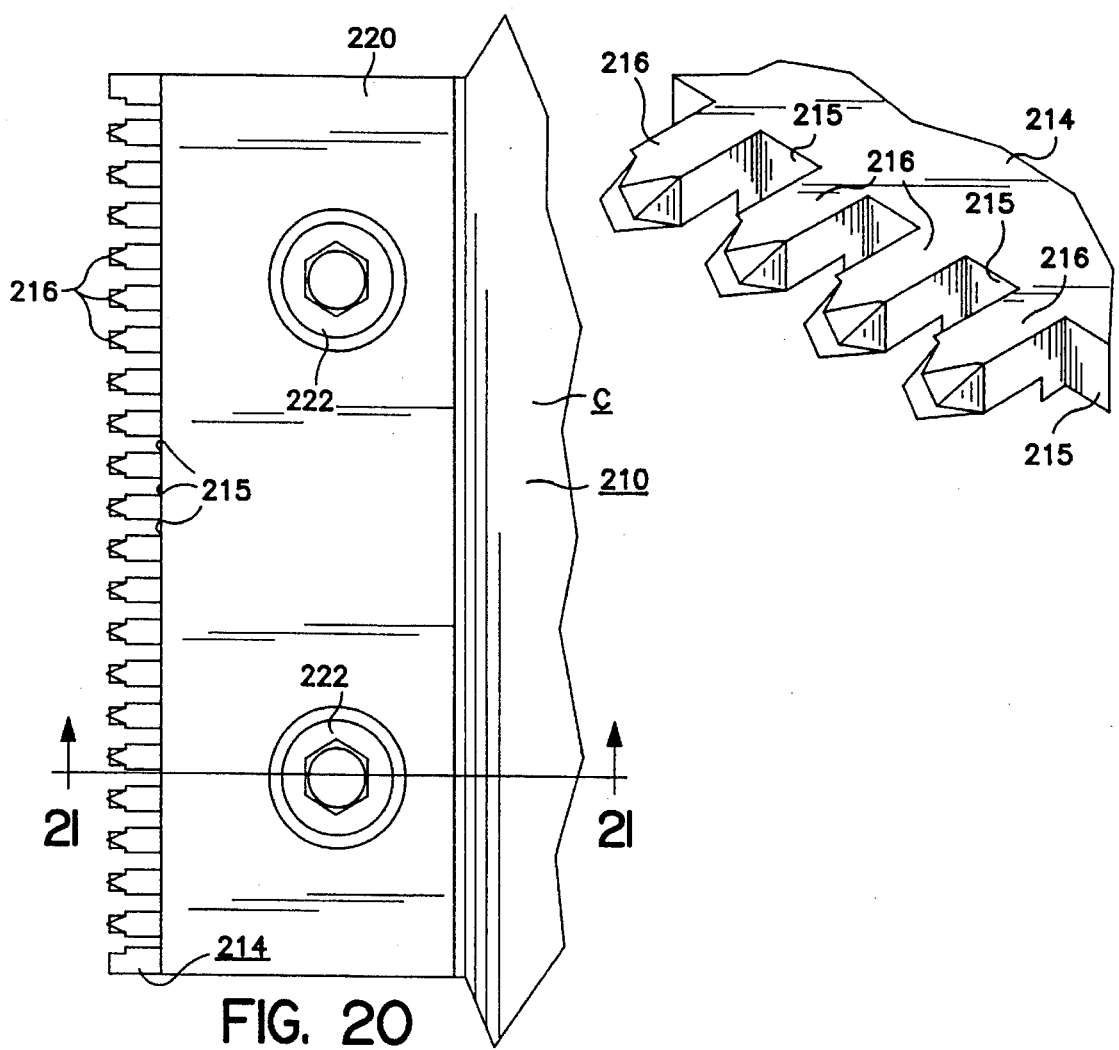
FIG. 22
FIG. 20

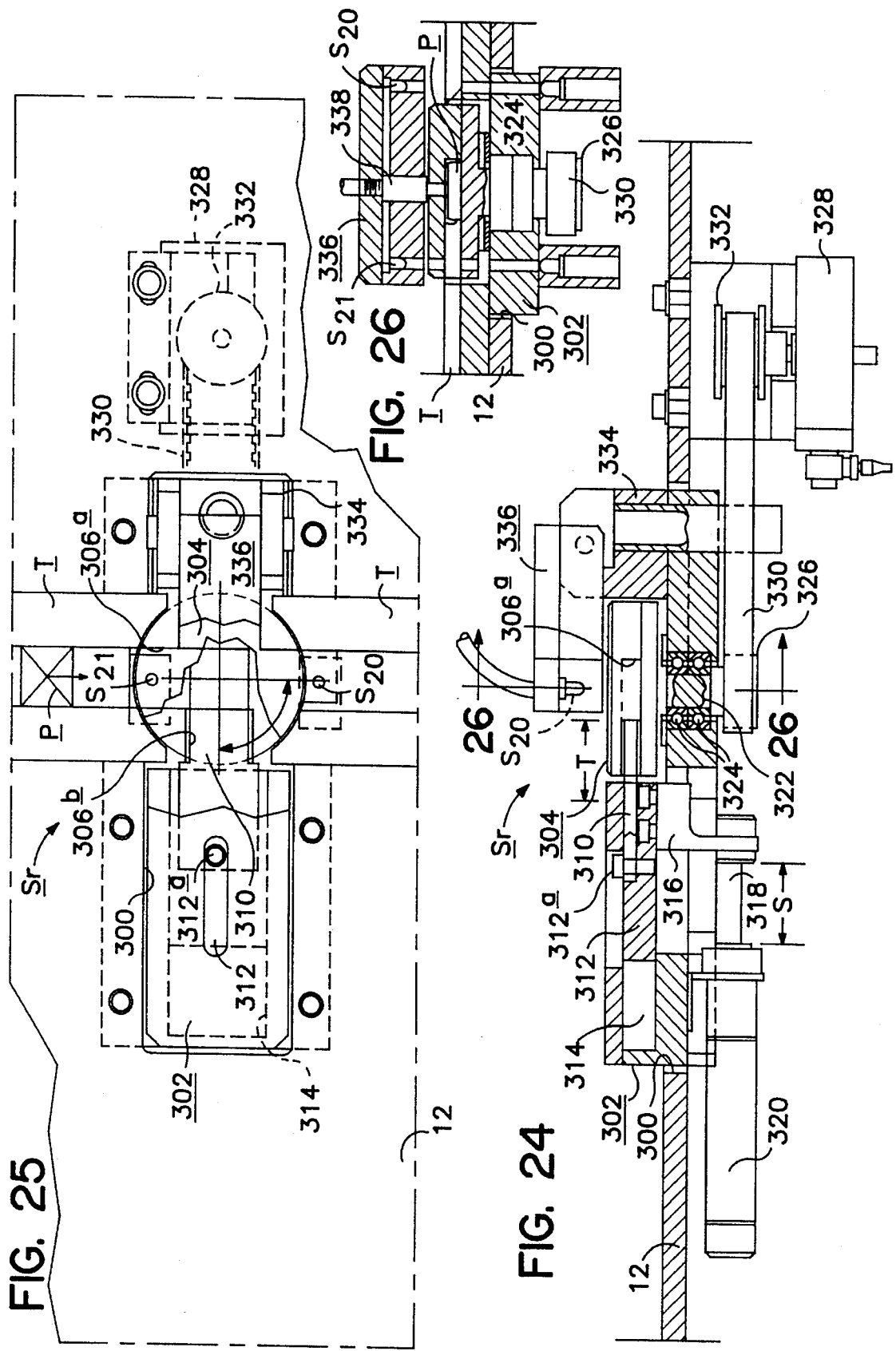

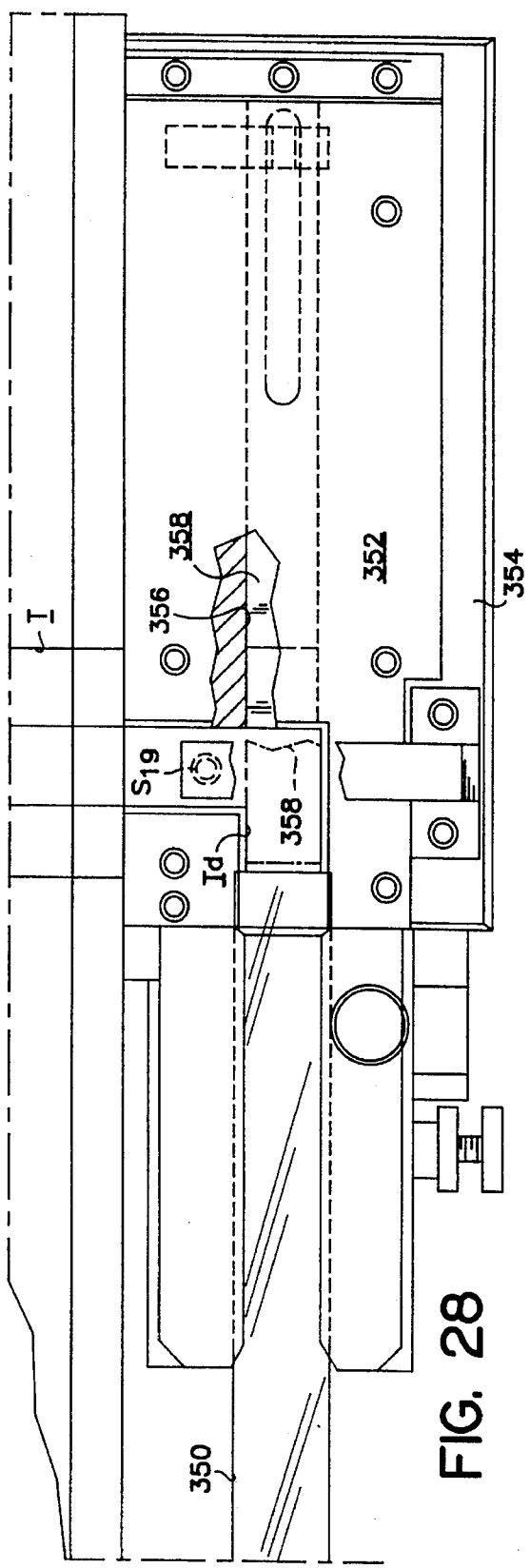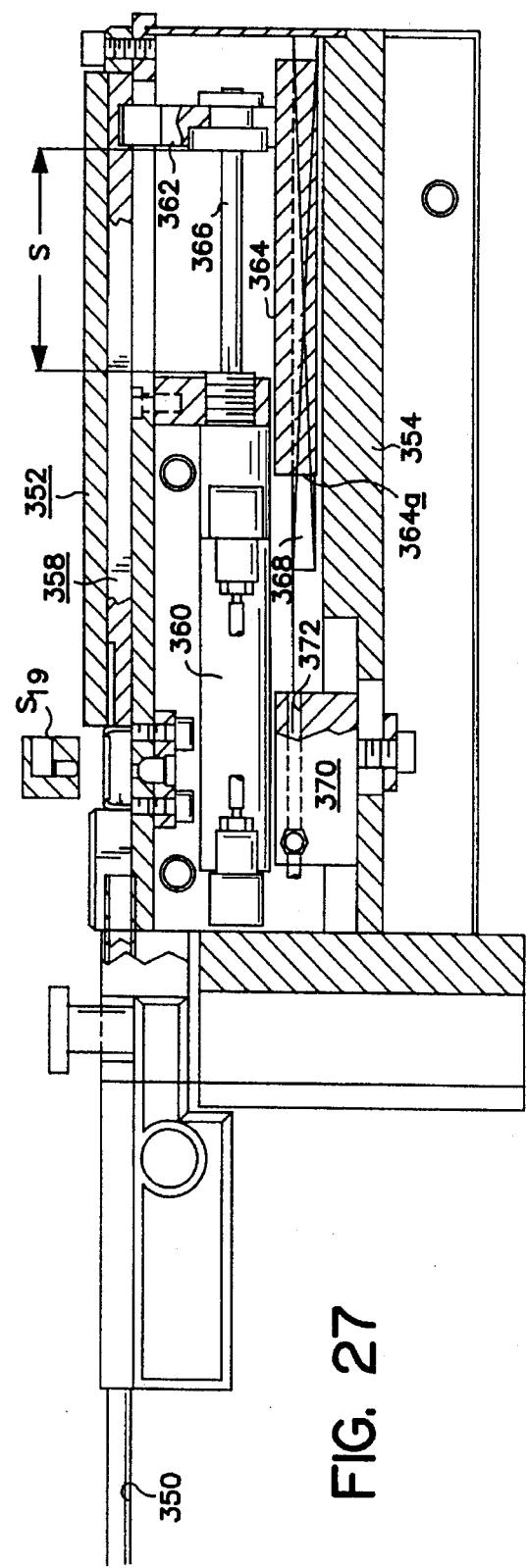
FIG. 28
FIG. 27

PLCC REFORMING AND RECONDITIONING SYSTEM, METHOD AND APPARATUS

FIELD OF THE INVENTION

The present invention relates generally to a system, method and apparatus for reconditioning or reforming electronic components of the type referred to herein as PLCC parts which is an acronym for PLASTIC LEADED CHIP CARRIER. These parts typically comprise a plural sided body portion, for example, square, having rows of leads of generally J-shaped configuration which extend from opposing sides. The system, method and apparatus of the present invention are particularly suited for reforming and realigning the J-shaped leads so that certain tolerances described hereinafter are within predetermined controlled limits necessary for proper use of these parts in the field.

BACKGROUND OF THE INVENTION

DIP devices and particularly the new PLCC part form an important part of the electronics industry. These devices are placed on a printed circuit board which has been silk-screened and treated to define precise locations for the solder pads of the device leads. These devices are required to conform to certain standards of uniformity for proper application to a printed circuit board. The configuration of the leads for these devices has gone through many stages in order to simplify and expedite the manufacture and assembly to printed circuit boards or the like. The well known prior art DIP devices include those which have leads depending generally transversely downwardly from opposite side edges of a rectangular plastic body portion which are insertable in openings in the printed circuit board. There are also so-called gull-winged SOIC devices of the type shown in U.S Pat. No. 5,146,101 owned by AMERICAN TECH MANUFACTURING CORPORATION, Assignee of the present application. This patent as well as other patents listed below show various methods and apparatus particularly suited for straightening, forming and scanning DIP devices:

| Inventor | U.S. Pat. No. | Issued |
| --- | --- | --- |
| Linker, Jr. et al | 4,686,637 | August 11, 1987 |
| Linker, et al | 4,705,152 | November 10, 1987 |
| Linker, et al | 4,787,426 | November 29, 1988 |
| Linker, Jr. | 5,113,916 | May 2, 1992 |

There are prior apparatus and methods for manufacturing devices having J-shaped leads such as in the NAKAJIMA U.S. Pat. No. 4,829,669 entitled METHOD OF MANUFACTURING A CHIP CARRIER issued on May 16, 1989. However, the prior apparatus and methods are not capable of reforming bent leads of manufactured devices in the manner of the present invention and specifically are not capable of raising any inwardly bent leads to reestablish the designated minimum H dimension for all of the leads which is the height dimension measured from the peaks to the base of the body portion of a lead.

SUMMARY OF THE INVENTION

These prior apparatus and systems are geared to scanning and reforming DIP/SOIC devices of the type described above and are not suitable for straightening and reforming PLCC parts because of the particular and unique lead shape and geometric configuration of the PLCC part. For example, the PLCC part by reason of its complex geometry and lead configuration requires multiple tolerances such as, "lead to lead" and "coplanarity" requirements which the prior art apparatus and systems are not capable of providing. Thus, even though these prior apparatus are extremely useful for the purposes intended and designed specifically for reforming and scanning the prior SOIC and DIP devices, the PLCC part presents special tolerance considerations which are admirably met by the system, method and apparatus of the present invention.

To this end, the apparatus includes an elongated trackway and various stations along the trackway for performing reforming and other operations on a PLCC part. Accordingly, PLCC parts are delivered one at a time by a singulating mechanism to a Corner Treatment Station where a die mechanism engages centrally of the array of leads and displaces bent inwardly directed leads sufficiently outwardly to form a contact surface for an anvil to engage interiorly of the array of leads at a later reforming station to insure against damaging the leads during the reforming operation. PLCC parts exiting the Corner Treatment Station flow by gravity along the trackway to a first Straightening Station for a reconditioning operation on two of the opposing rows of leads of the PLCC part. A pair of opposing slide assemblies carrying combs are cycled through the leads at the terminal end of the first straightening cycle, the combs engaging between the curled J terminal ends of the leads in reforming recesses in the face of the anvil. In this position, a greater seating or clamping force is exerted on the PLCC part by the anvil and the comb assemblies are oscillated from pin to pin to remove sweep error. Thereafter, with the combs still engaging between the J portions of the leads, the anvil pressure is reduced somewhat and the anvil moves first to the left of center to reform the terminal ends of the leads of one row and then in the opposite direction to reform the leads of the opposing row by engagement against reforming surfaces in the anvil and a surface of the combs.

PLCC parts exiting the first Straightening Stations then enter a Rotation Station downstream which rotates the PLCC part ninety degrees (90°) and discharges it to the trackway where it enters a second Straightening Station to effect straightening and reforming of the leads in the other opposing row of leads of the PLCC part. The fully reconditioned PLCC part is then moved to a Discharge Station for automatic packaging into collection cartridges or tubes.

A logic keyboard for operating the various mechanisms of the present invention in predetermined timed sequences to achieve the automatic processing of PLCC parts in the general manner described above is provided which is of relatively standard form. An example of an typical logic keyboard circuitry for achieving controlled operation of the type described herein is in LINKER. U.S. Pat. No. 4,686,637 entitled APPARATUS AND METHOD FOR LEAD INTEGRITY DETERMINATION FOR DIP DEVICES issued Aug. 11, 1987.

The present invention provides a relatively simple system for reconditioning and straightening PLCC parts automatically and at high speeds which can be easily and quickly adapted for plural sided PLCC parts of different geometric configurations and poly sided parts of different sizes. The system, apparatus and method of present invention provide an effective and simple system for reconditioning PLCC parts and reestablishing critical tolerance requirements including lead to lead and coplanarity parameters.

BRIEF DESCRIPTION OF THE DRAWINGS

These and other objects of the present invention and the various features and details of the operation and construction thereof are hereinafter more fully set forth with reference to the accompanying drawings, wherein:

FIG. 3 is an enlarged plan view taken on lines 3—3 of FIG. 2 showing the various stations of the apparatus and system of the present invention for performing various reconditioning functions on PLCC parts;

FIG. 6A–6N and 6P inclusive, are views showing sequentially the various straightening and reconditioning operations performed by the apparatus and system of the present invention;

FIG. 6A is an enlarged fragmentary side elevational view of the PLCC part at the Corner Treatment Station illustrating parts of the apparatus and their relative positions as the PLCC part enters the station;

FIG. 6H is a view similar to FIG. 6G showing the combs in an outer limit position ready to traverse the leads for the first combing action on two opposing rows of leads of the PLCC part;

FIG. 6N is an enlarged transverse sectional view showing the anvil in a raised position and the combs in a "home" position;

FIG. 6P is a fragmentary side elevational view showing the position of the parts with the stop pin retracted to permit exit of the PLCC part from the first Straightening and Reconditioning Station to the Rotary Station to rotate the PLCC part 90° for reconditioning the leads in the other two opposing rows of leads of the PLCC part;

FIG. 20 is a greatly enlarged fragmentary plan view showing the tooth array and geometry of the teeth of the comb assembly;

FIG. 21 is an enlarged sectional view taken along lines 21—21 of FIG. 20;

FIG. 22 is an enlarged fragmentary perspective view showing the geometry and array of the comb teeth;

FIG. 24 is an enlarged fragmentary transverse sectional elevational view taken on lines 24—24 of FIG. 3 showing some of the elements of the apparatus comprising the Rotation Station;

FIG. 25 is a fragmentary plan view with pans broken away of the Rotation Station detail shown in FIG. 24;

FIG. 26 is a sectional view taken on lines 26—26 of FIG. 24 showing sensors and additional details of the turntable and sensor locations at the Rotation Station;

FIG. 27 is an enlarged sectional elevational view taken on lines 27—27 of FIG. 3 showing the Discharge Station for discharging reformed PLCC parts into a collection cartridge; and FIG. 28 is a fragmentary plan view of the details of the portion of the apparatus shown in FIG. 27.

DETAILED DESCRIPTION OF THE PREFERRED EMBODIMENT

Figure 1:
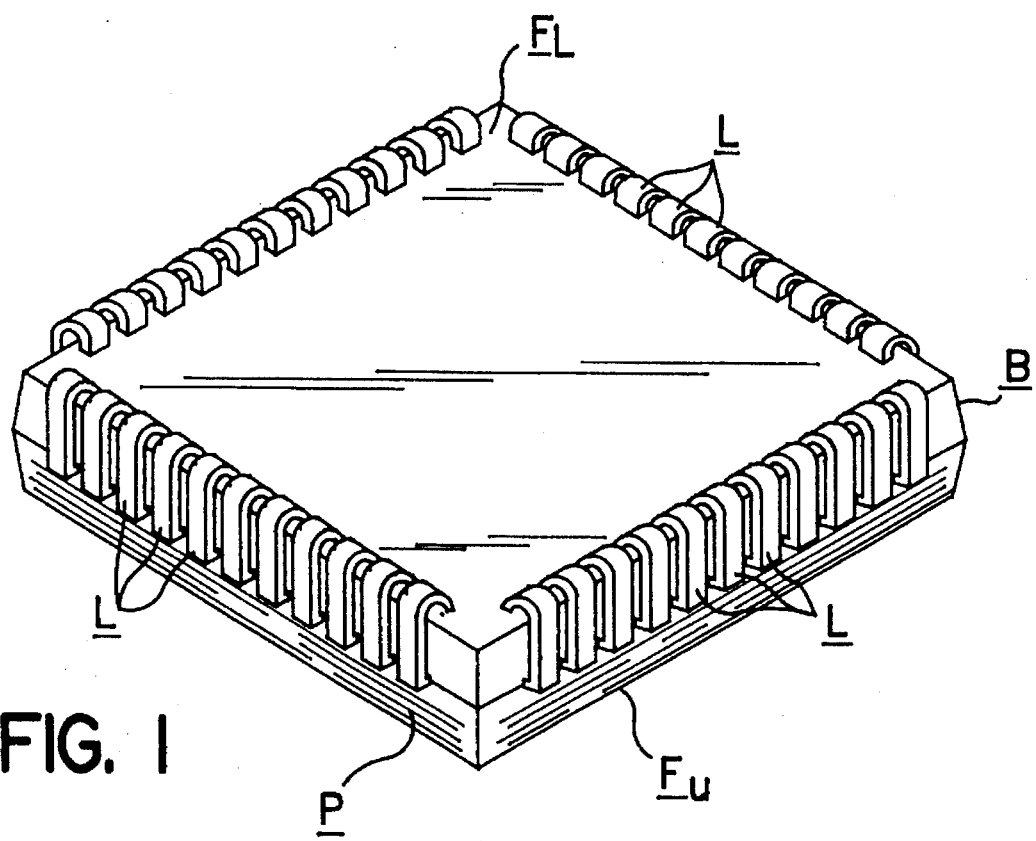
FIG. 1 is an enlarged isometric view of an electronic component comprising a generally square body portion and a series of J-shaped leads on all four sides referred to herein as a PLCC part.

The apparatus, system and method of the present invention are particularly suited and adapted for combing and reconditioning leads of electronic chip devices having leads around their entire periphery. More specifically, the apparatus, system and method, are particularly adapted for use with so-called PLCC parts P of the type illustrated in FIGS. 1, 4 and 5 which have a generally square or rectangular body portion B and a plurality of leads L arranged in rows about the periphery of the body B. Thus, in the present instance, there are four rows $R_1$, $R_2$, $R_3$, and $R_4$ of leads L on the four right angularly disposed sides of the body portion B. In the present instance, the leads L are of J-shaped configuration and comprise a shoulder $L_s$ connecting the lead L to approximately the mid point of the body portion B, a generally vertically disposed leg portion $L_1$ and a curved tip portion $L_t$ having a peak or apex $L_p$. The lower portion of the leg $L_1$ is wider than the upper portion defining a transition shoulder $L_{ts}$ at approximately the mid point of the leg $L_1$ of the lead L. Accordingly, the space between adjacent leads L at the lower portion or base is narrower than the space between adjacent leads at the tip portion $T_t$.

PLCC parts P of the type described above, are typically packaged in elongated cartridges or tubes for shipment from the manufacturer to end users. It has been found that the rather delicate leads L of the PLCC part P are damaged or deformed somewhat in shipment and handling, particularly the corner leads so that they are no longer running true, 100% specification and are not suitable for assembling PLCC parts P to printed circuit boards and the like. For example, in some instances, the leads L are bent or deformed to a point where the peaks $L_p$ of some of the leads L are below the specified minimum H dimension also referred to herein as the "stand off" height. The present invention therefore provides apparatus, method and system for reconditioning leads to place them again in true 100% specification. For example, as explained in more detail hereinafter, the unique features of the reforming cycle results in raising the peaks $L_p$ of some of the leads L and lowering the peaks $L_p$ of other leads L so that they all are reformed above the minimum H dimension and are coplanar.

The term "reconditioning" as used herein broadly means placing a PLCC part P in true, 100% specification. The reconditioning method and apparatus described herein involves a number of operations on the leads L including a straightening operation whereby the leads L are positioned in an array parallel to one another and to axes A—A and B—B (See FIGS. 4 and 5). The straightening operation spaces the individual leads a predetermined distance S relative to one another referred to as "pin-to-pin" spacing. Reconditioning also restores a predetermined peak-to-peak tolerance designated by the letter C in FIGS. 4 and 5 and insures that the apex of the curved J-shaped tip portion of the leads all lie in a common plane P-P referred to herein as "coplanarity".

There are critical tolerances for assembling PLCC parts P to printed circuit boards and the like. For example, the peak-to-peak distance between the opposing rows of leads designated C needs to be within prescribed, predetermined tolerance limits. Additionally, the distance from the peaks $L_p$ of the leads L to the lower face FL of the PLCC part designated H needs to be within a predetermined prescribed limit and the peaks $L_p$ of all of the leads L need to be in a common plane P-P also referred to herein as lead "coplanarity". Further, the lead-to-lead distance S should be a constant for all adjacent leads in the rows of leads and parallel to one another and to a plane A—A and B—B transverse to the plane P-P and this is commonly referred to as "perpendicularity".

Consider first the operation of the apparatus, system and method of the present invention in broad terms and with reference to the basic components of the system and how they function to recondition PLCC parts P.

Figure 2:
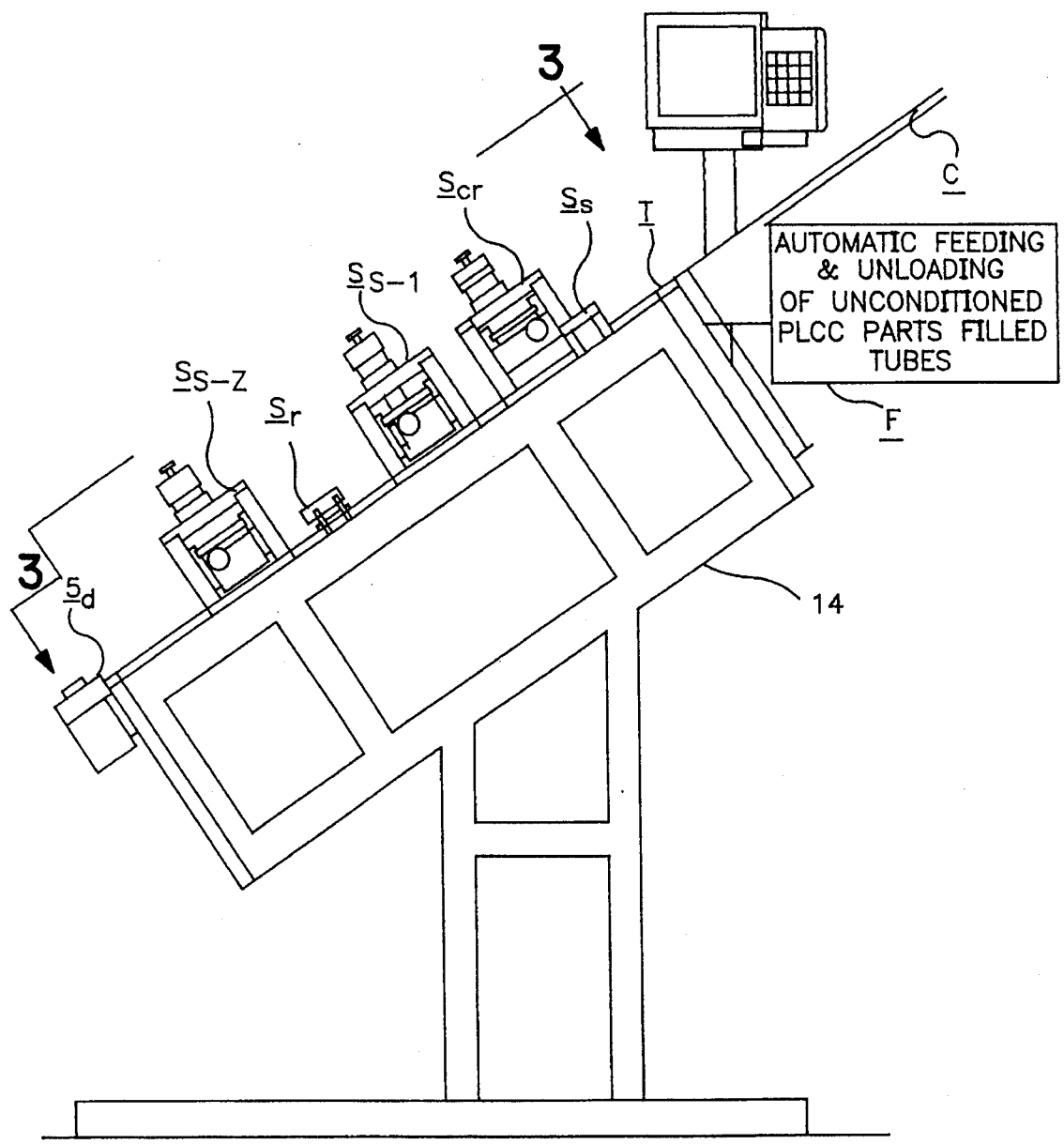
FIG. 2 is a right side elevational view of greatly reduced scale showing an automatic PLCC lead reconditioning apparatus and system for processing PLCC parts.

Tubes filled with PLCC parts P to be reconditioned are automatically presented by a feeding and unloading mechanism F to the entrance end of the trackway T. As illustrated in FIGS. 2 and 3, PLCC parts P are gravity fed along the trackway T with the upper face $F_u$ sliding on the trackway T to various stations including a Singulating Station $S_s$, a Corner Treatment Station $S_{cr}$, a first Straightening Station $S_{s-2}$, a Rotation Station $S_r$, a Second Straightening Station $S_{s-2}$ and a Discharge Station $S_d$.

Figure 6A:
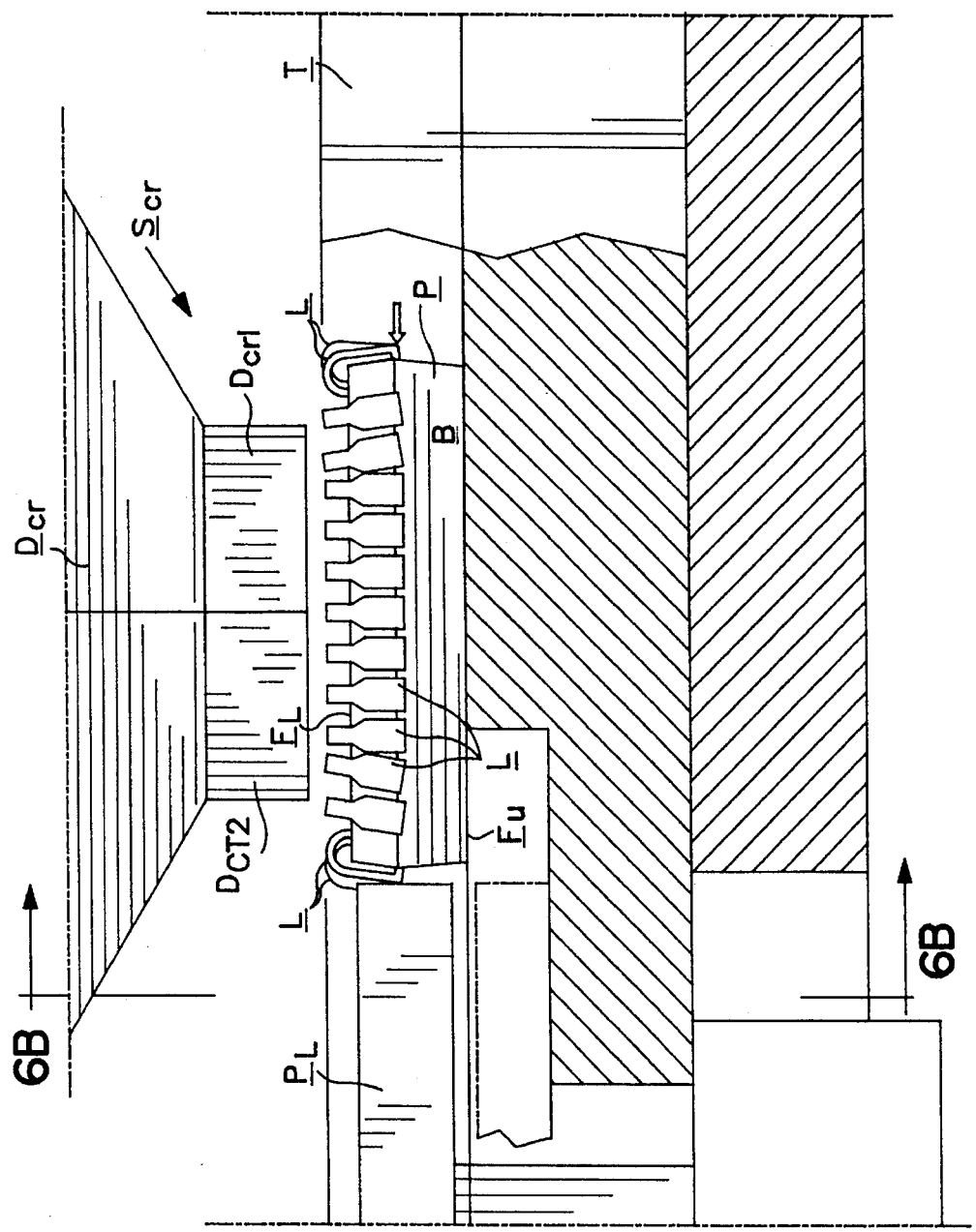
Figure 6B:
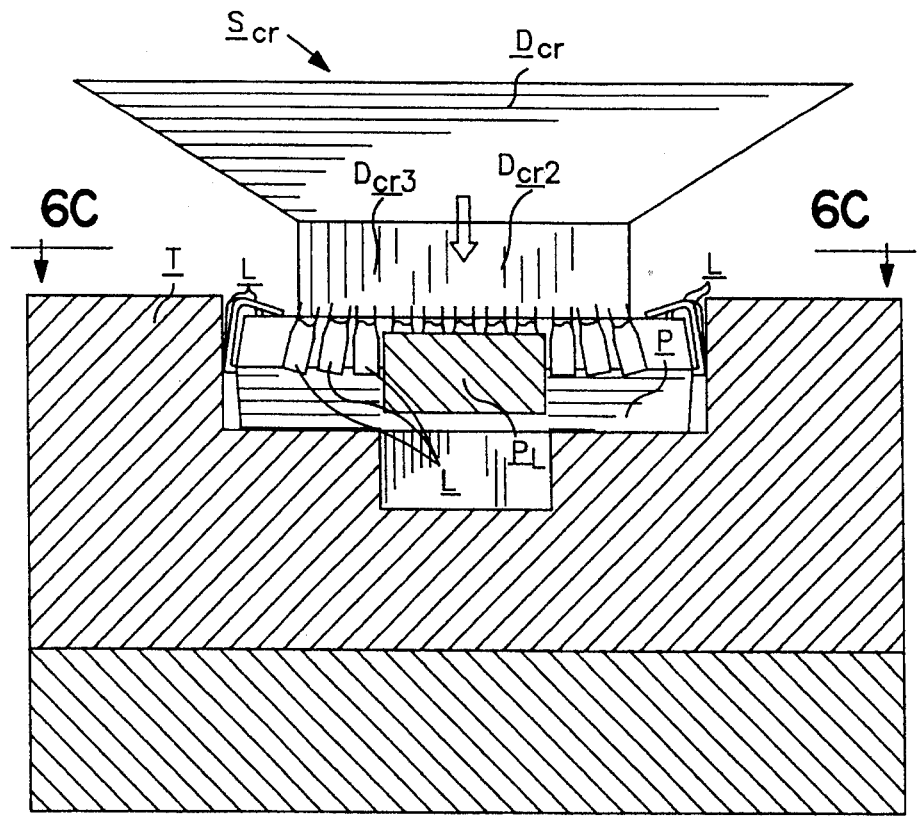
FIG. 6B is a transverse sectional view showing the corner forming dies in a closed position exerting a downward pressure on the PLCC part and holding it in a fixed position at the Corner Treatment Station.
Figure 6C:
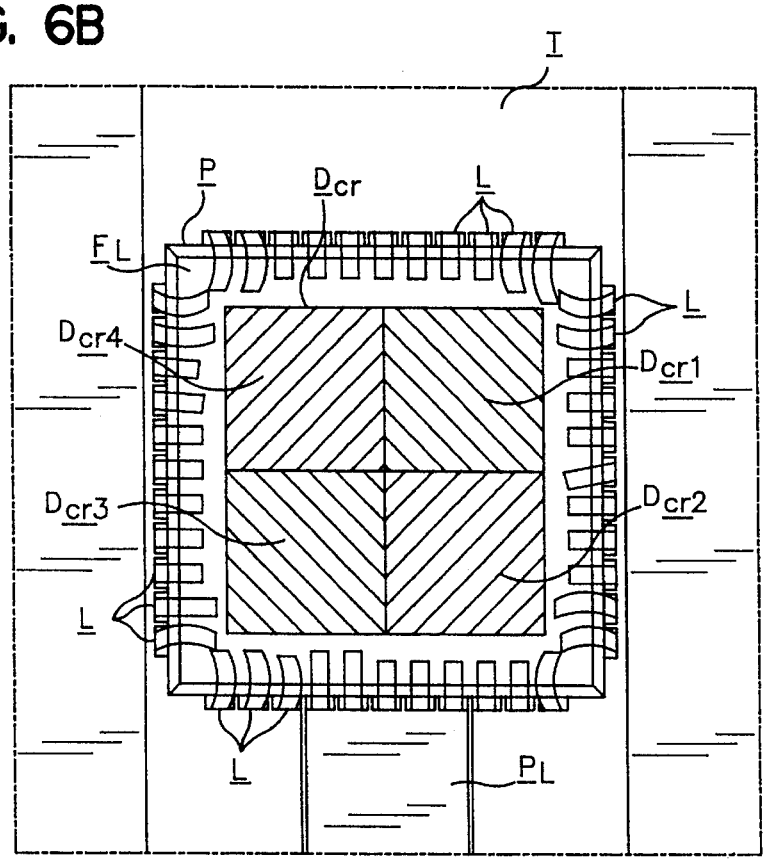
FIG. 6C is a sectional plan view taken on lines 6C—6C of FIG. 6B showing deformed leads of the PLCC part.
Figure 6D:
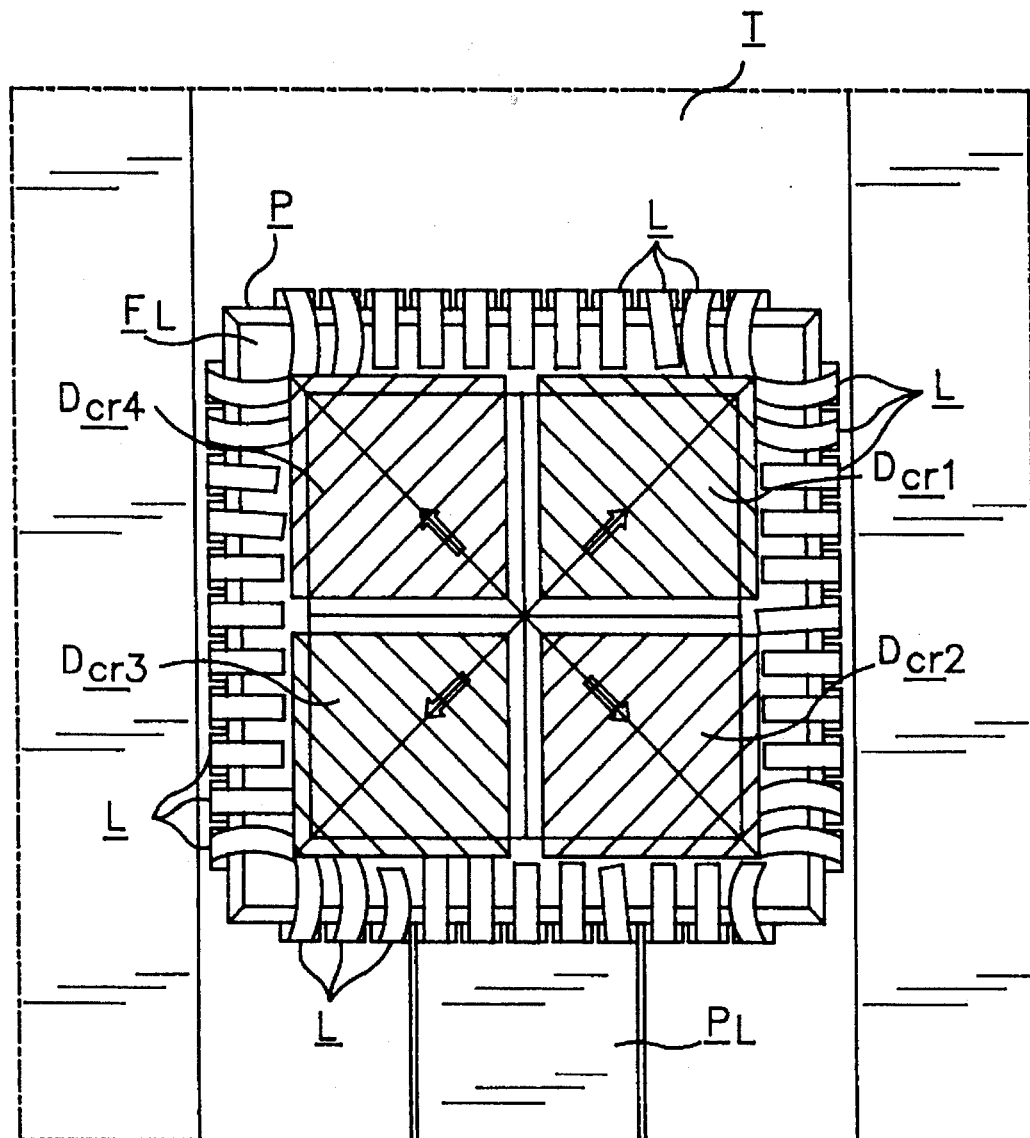
FIG. 6D is a fragmentary plan view similar to FIG. 6C showing the corner forming dies in an extended position to reposition the most damaged leads and condition them to insure proper anvil seating in further combing and straightening cycles.
Figure 6E:
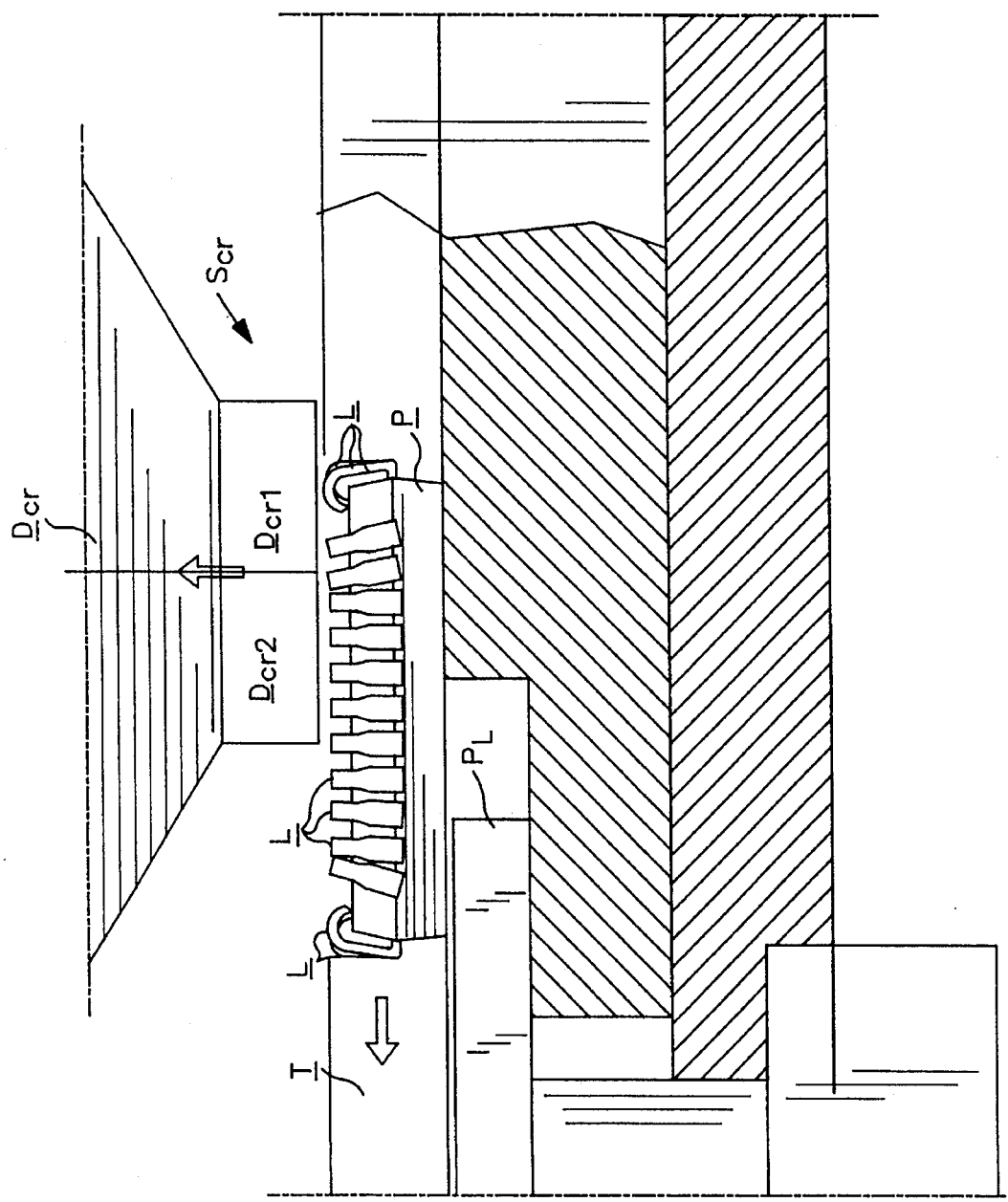
FIG. 6E is an enlarged fragmentary side elevational view similar to FIG. 6A with the die raised illustrating the PLCC part being moved to the next station.
Figure 6F:
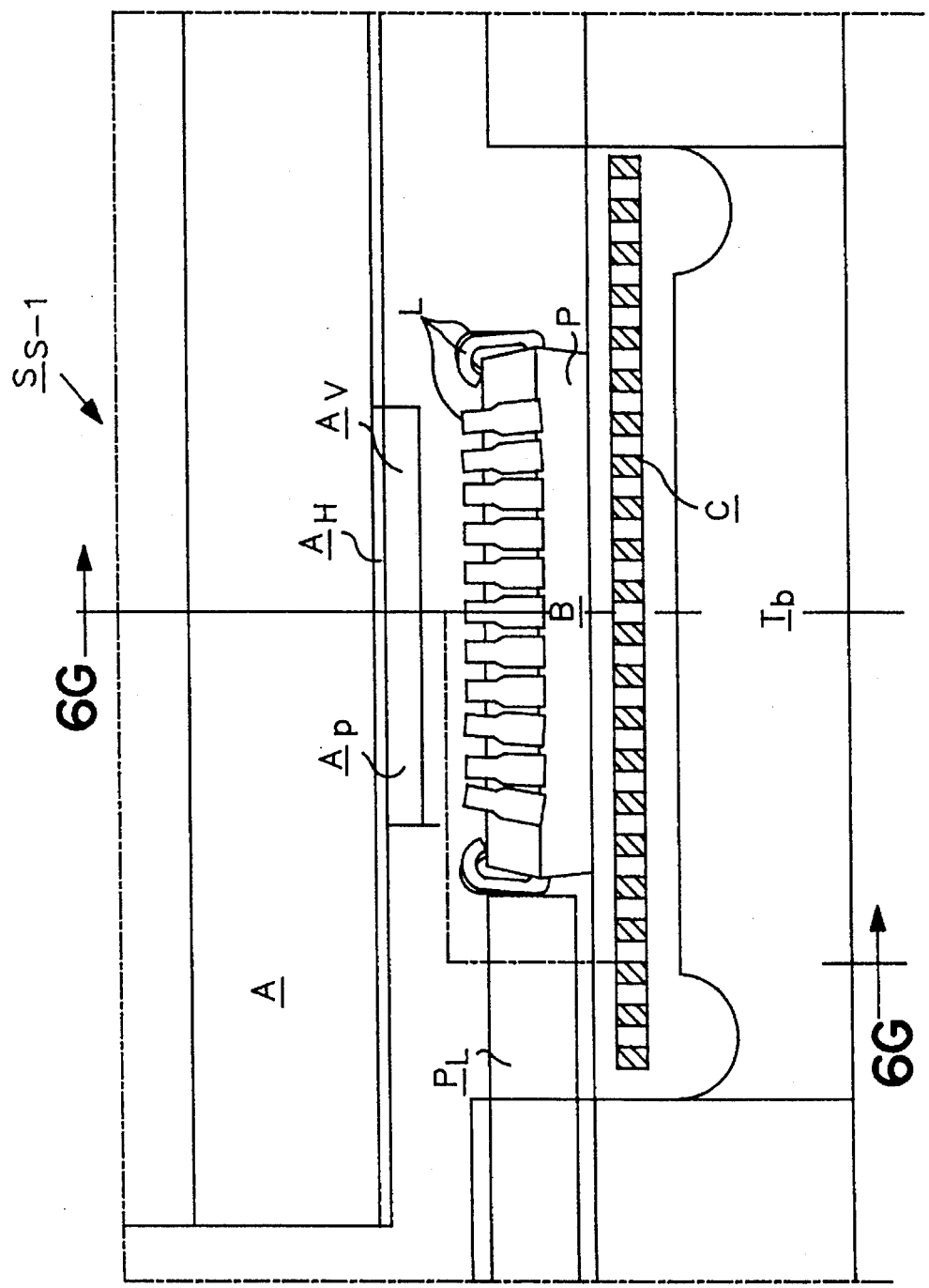
FIG. 6F is an enlarged fragmentary side elevational view of the first Straightening and Conditioning Station showing the anvil in a raised position.
Figure 6G:
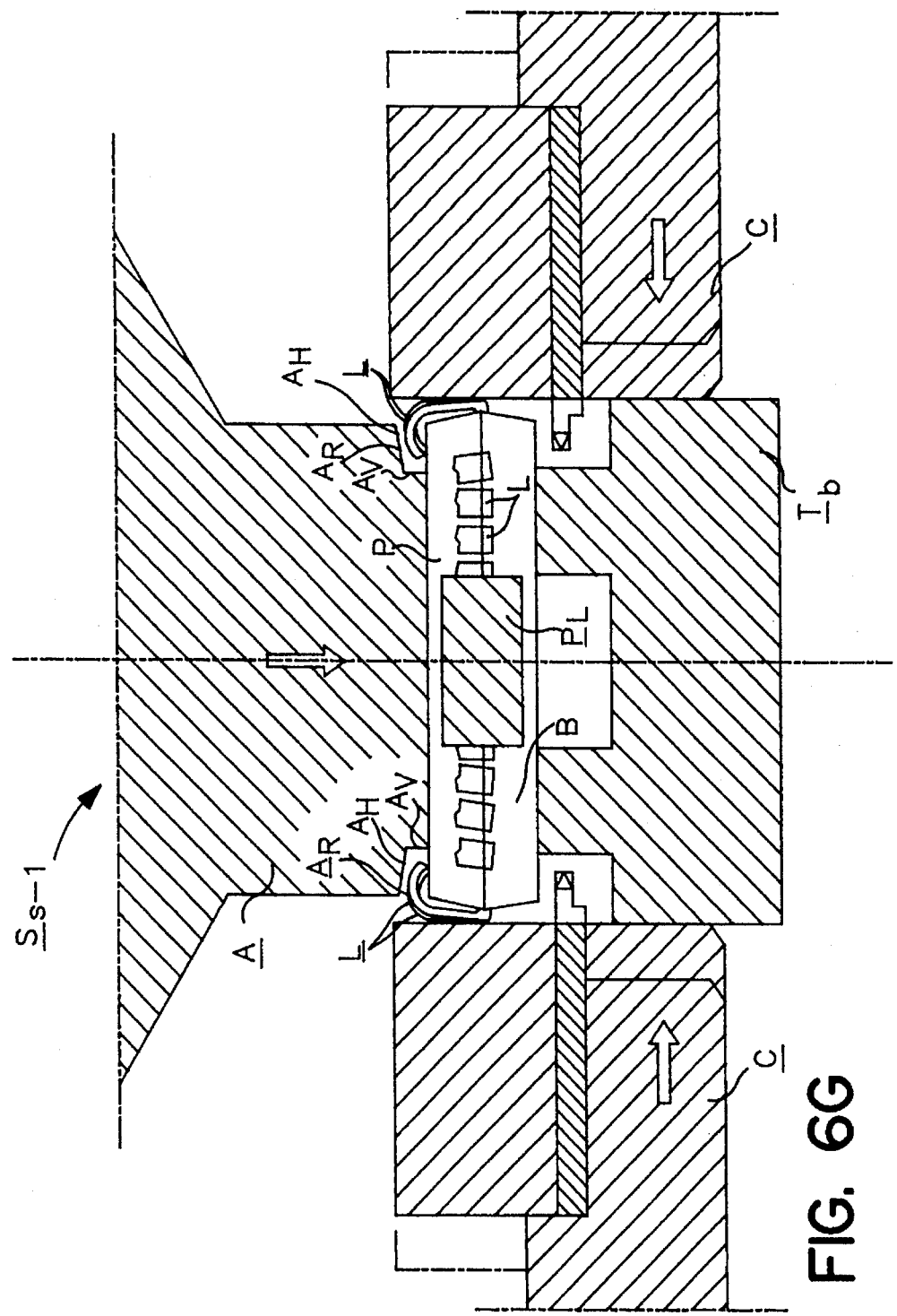
FIG. 6G is a transverse sectional view taken on lines 6G—6G of FIG. 6F showing the anvil in a lowered clamping position to hold the PLCC part in place during the first straightening operation.
Figure 6I:
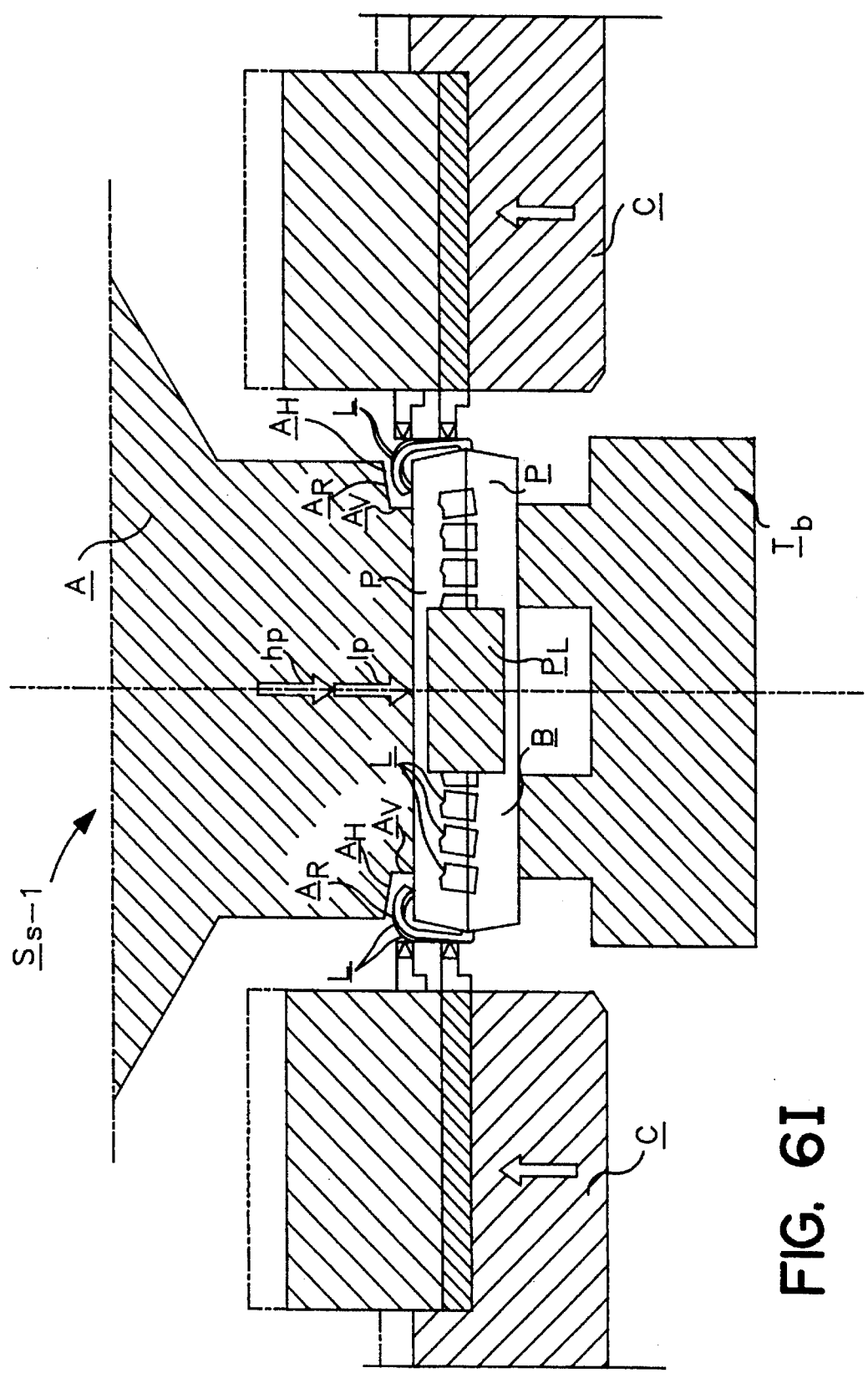
FIG. 6I is a view similar to FIG. 6H showing the combs in the upper limit position (dot and dash outline) after having combed opposing two of the four rows of leads of the PLCC part.
Figure 6J:
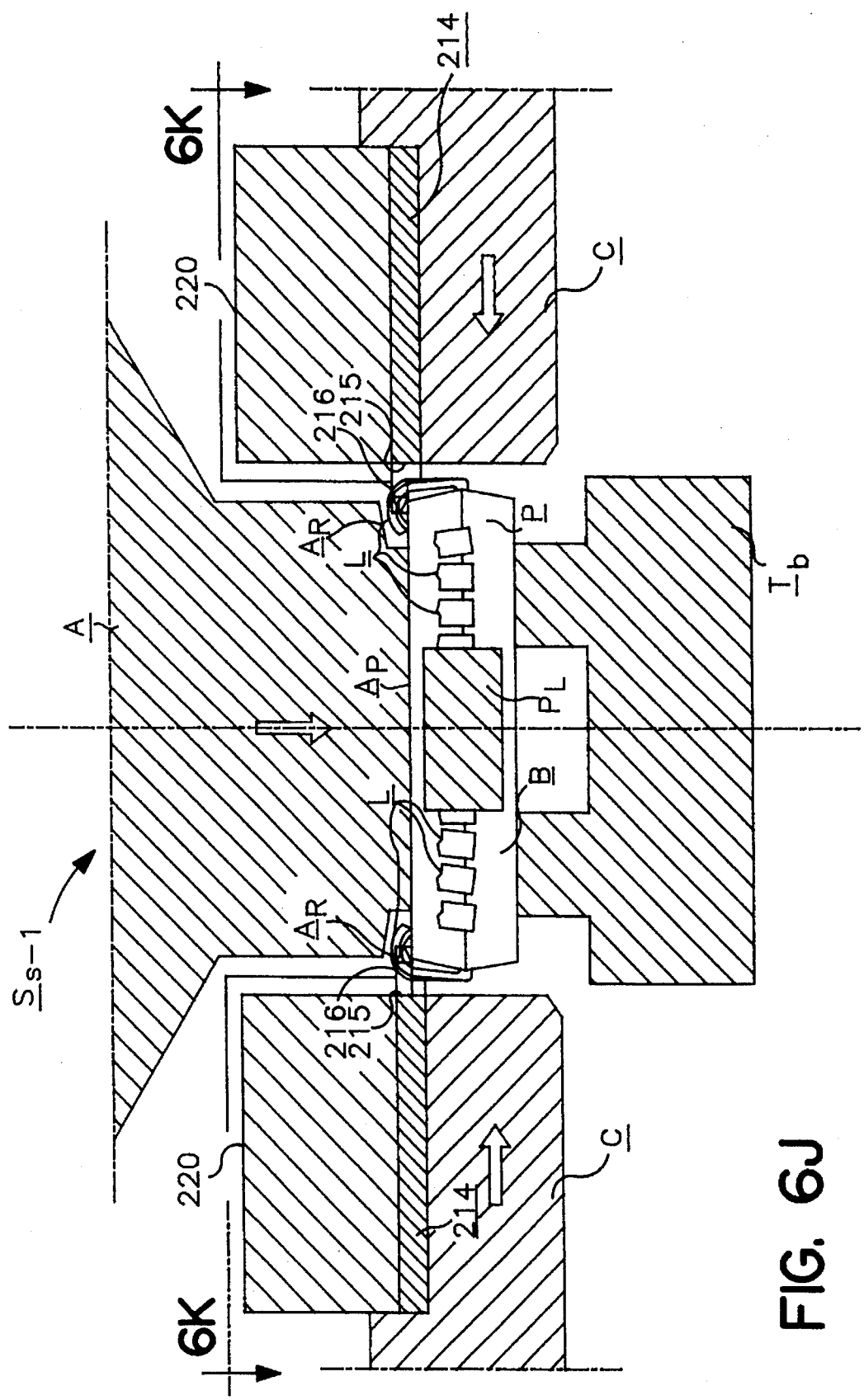
FIG. 6J is a view similar to FIGS. 6G, 6H, and 6I, showing the combs extending between the J portion of the leads for the oscillating step operation.
Figure 6K:
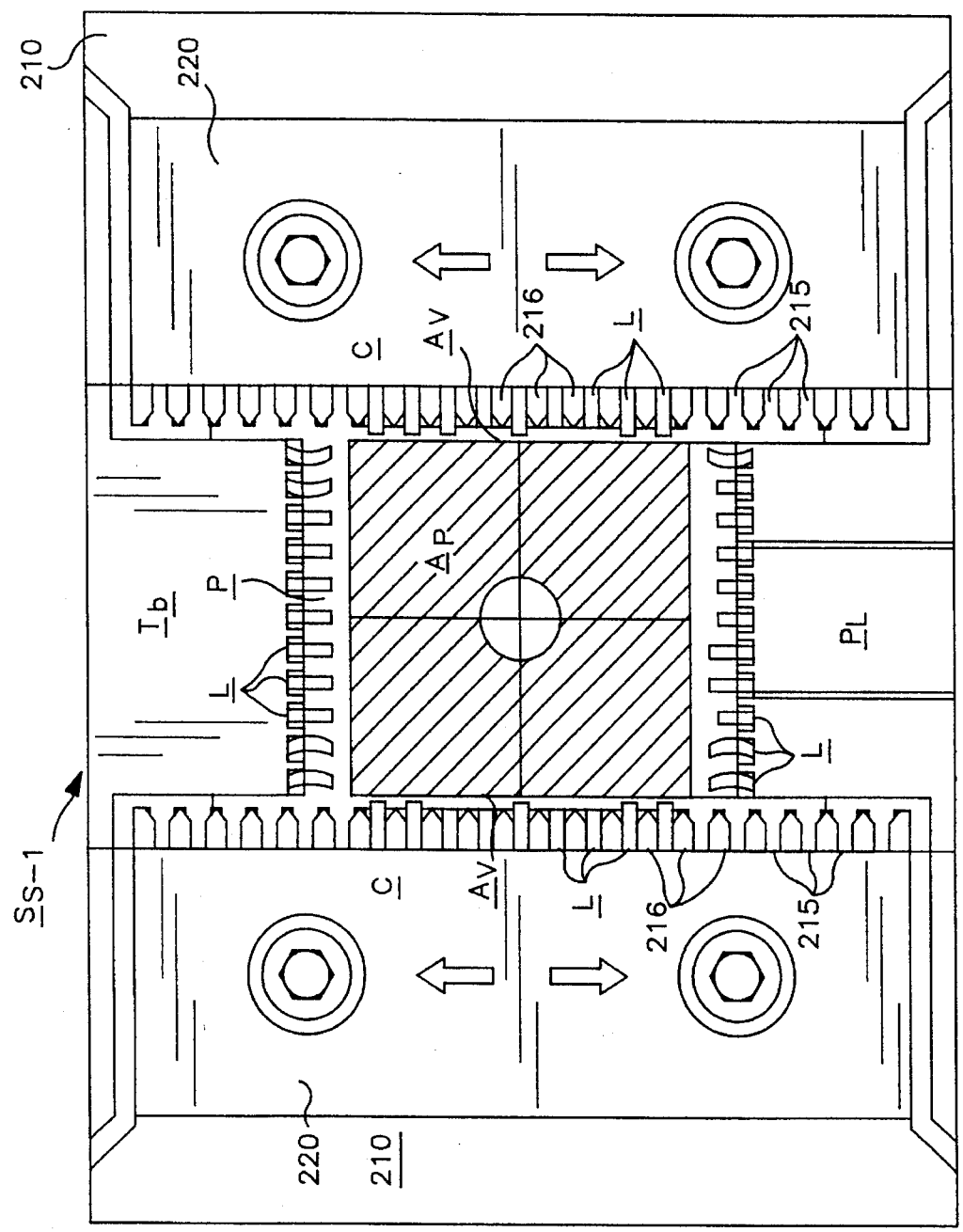
FIG. 6K is a plan view taken on lines 6K—6K of FIG. 6J again showing the interengagement of the combs and the leads during the oscillating sequence or cycle.
Figure 6L:
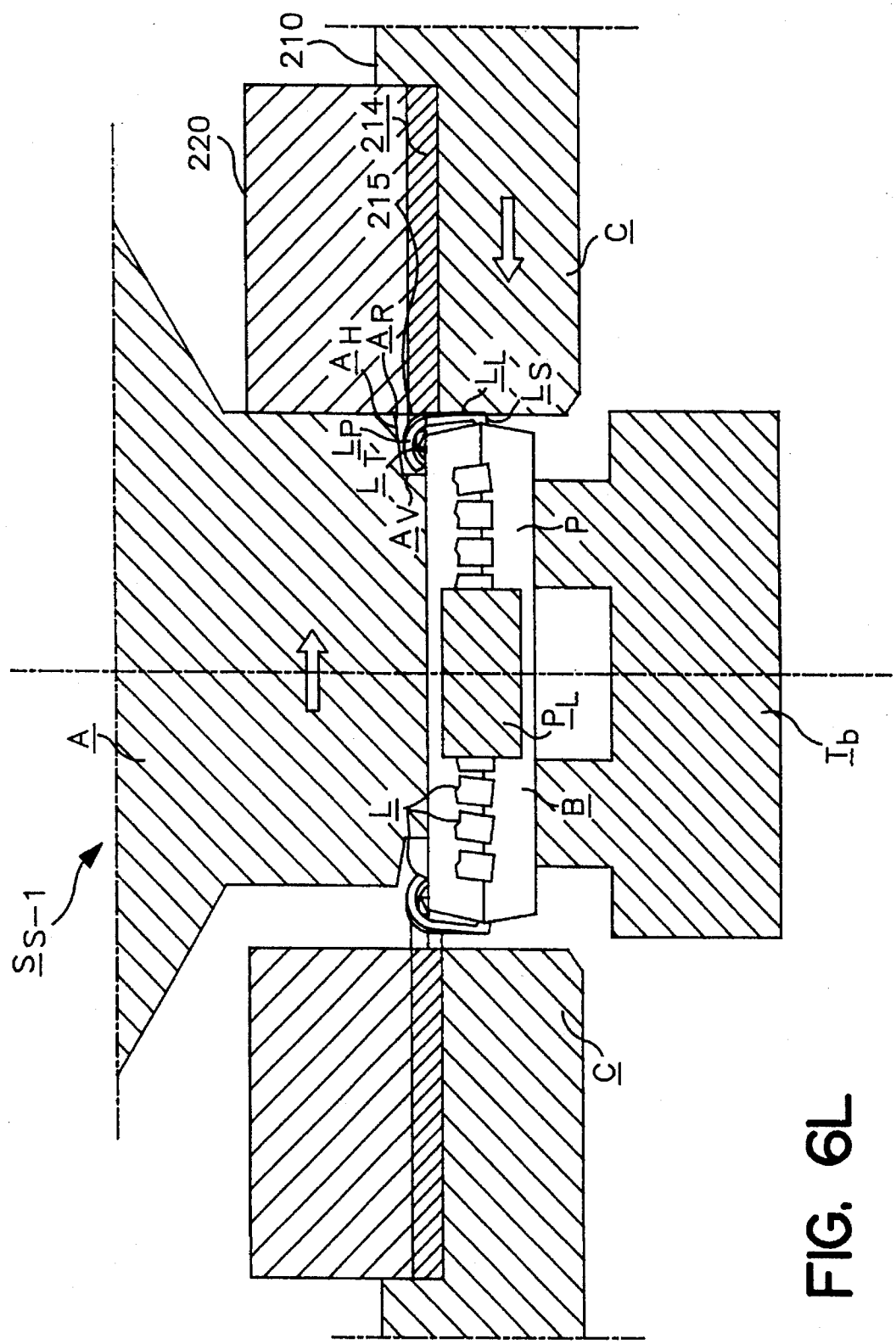
FIG. 6L is another view similar to the prior tour views showing the anvil displaced first to the right to effect reforming and coplanarity of the fight hand row of leads of the PLC C part.
Figure 6M:
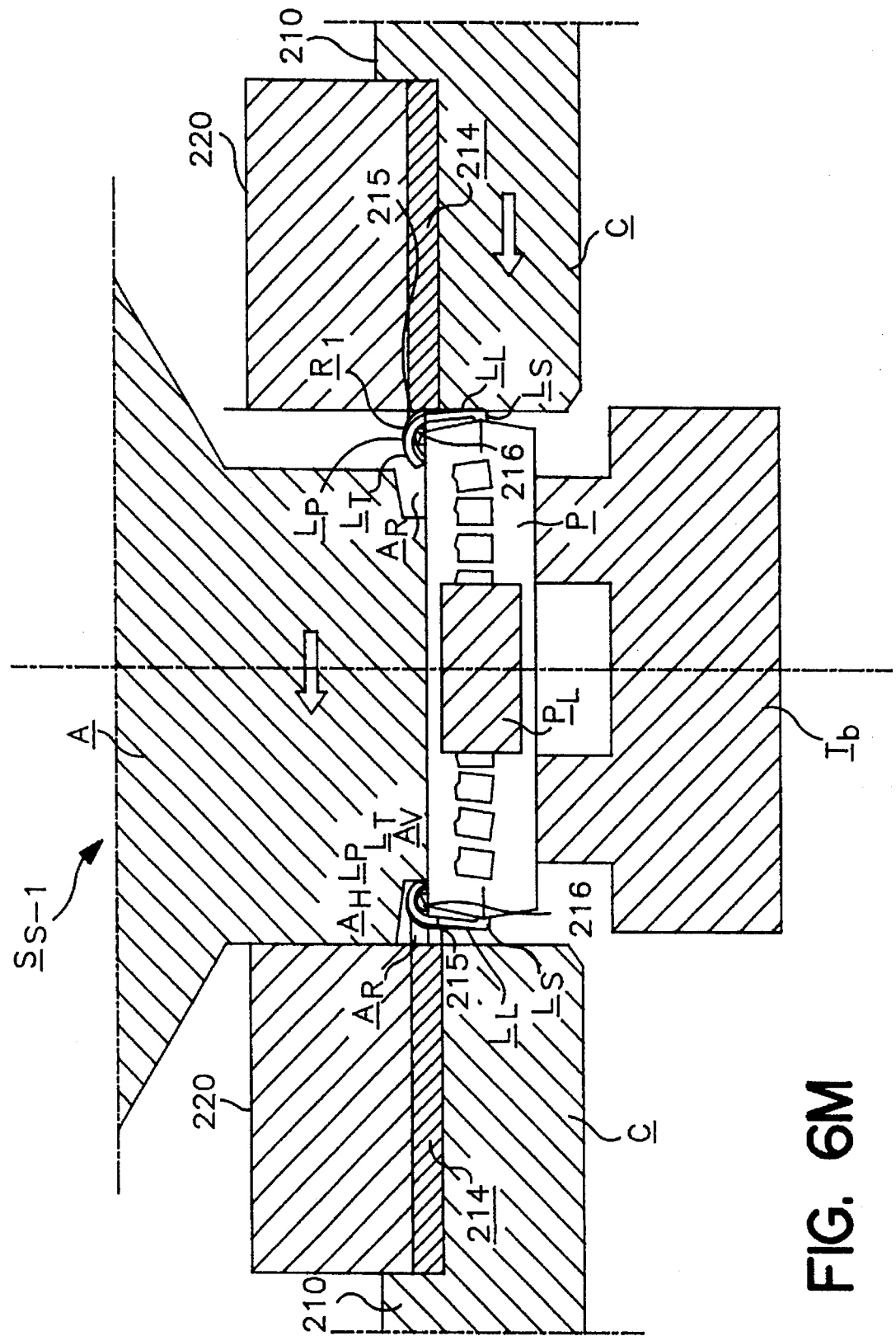
FIG. 6M is an enlarged fragmentary sectional view showing the anvil moved in the opposite direction to effect reforming and coplanarity of the opposing row of leads of the PLC C part.
Figure 6P:
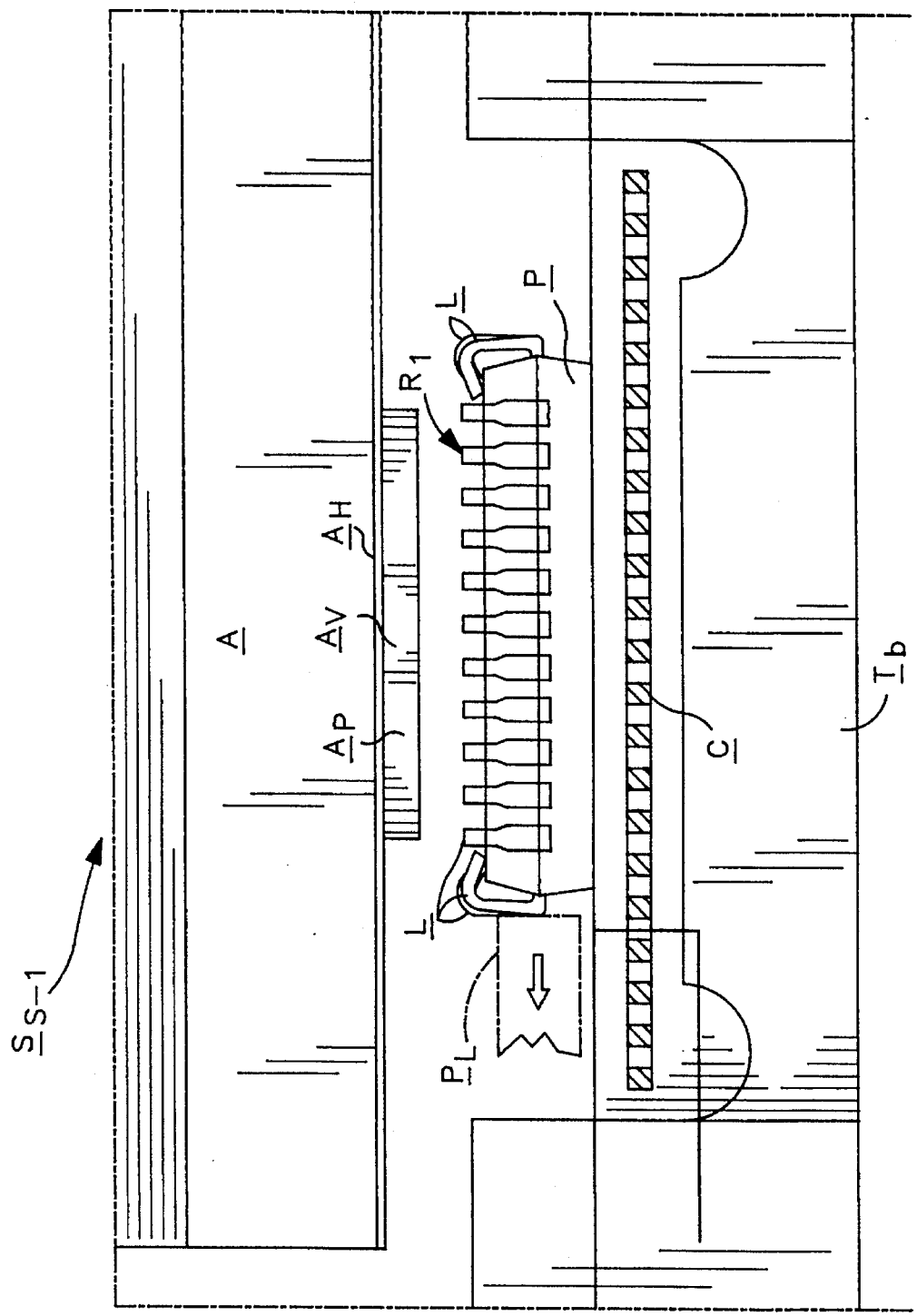

Consider now a complete cycle of operation of the apparatus and with particular reference to FIGS. 6A–6P inclusive, PLCC parts P are delivered one at a time to the Corner Treatment Station $S_{cr}$. The PLCC part P engages a part locator $P_L$, locating the PLCC part P in a predetermined position with respect to a forming die $D_{cr}$. With the PLCC part P in place, the die $D_{cr}$ is lowered to the position shown in FIGS. 6B and 6C. The four die elements $D_{cr-1}$, $D_{cr-2}$, $D_{cr-3}$ and $D_{cr-4}$ comprising the die $D_{cr}$ are then actuated radially outwardly as shown in FIG. 6D. This action sweeps back any damaged leads L and creates a lead free center face area in the lower face $F_L$ of the PLCC part P freely engageable by the pad $A_p$ an anvil A during the reforming cycle as explained in more detail hereafter without damaging leads L of the PLCC part P.

Thereafter, the die $D_{cr}$ is raised (See FIG. 6E), the part locator $P_L$ is retracted and the PLCC pan P moves by gravity down the trackway T to the first Straightening Station $S_{s-1}$ (See FIG. 6F). When the PLCC part P is in position at the first Straightening Station $S_{s-1}$, the anvil A is lowered to exert a light pressure on the PLCC part P against the bridge track $T_b$ in the manner shown in FIG. 6G. The combs C on opposing sides of the bridge track $T_b$ are then cycled from their lower limit position upwardly to engage through the leads L of the opposing rows $R_1$ and $R_2$ of the PLCC part P to align them generally in a vertical direction. More specifically, the combs C are first actuated outwardly from one another from a position shown in FIG. 6G to the position shown in FIG. 6H so that the tips of the fingers of the combs C clear the body portion B of the PLCC part P when they are raised to extend through the leads in the manner shown in FIG. 6I. It is noted that during the initial upward stroke of the combs C, the pressure of the anvil A seating the PLCC part P against the trackway T is relatively light in the order of about 24 p.s.i. to allow for small adjusting movements of the PLCC part P in the bite of the anvil A and trackway T and thereby prevent damage to the leads L. During the upper half of the stroke, the pressure is increased to about 255 p.s.i. to firmly immobilize the part in the bite of the anvil A and trackway T.

The combs C are again moved inwardly toward one another at the top of the stroke shown in FIG. 6J to a position within the pockets or recesses in the anvil A and between the J terminal end portions of the leads L. In this position, with the PLCC part P firmly clasped between the anvil A and the trackway T, the combs C are oscillated in a predetermined range which pivots each of the leads L at the point of connection to the body portion B a predetermined amount and therefore minimizes spring back and insures the precise "pin-to-pin" spacing S. The oscillating movement of the combs C is schematically shown in FIG. 6K.

The main body portion of the anvil A is generally rectilinear and the anvil pad $A_p$ is in the present instance, of square cross section and as illustrated in the drawings, smaller in cross sectional dimensions than the lower face of the anvil to define reforming recesses $A_r$. More specifically, the pad $A_p$ has four planar sidewalls $A_v$ of a predetermined height generally equal to the H dimension for a given PLCC part. The lower face of the anvil extending generally perpendicularly to the sidewalls $A_v$ defines generally horizontally extending walls $A_h$ which as illustrated are slightly tapered outwardly and upwardly. The walls $A_v$ and $A_h$ define the reforming recesses $A_r$. Note that the root or base between adjacent fingers of the comb assembly abut the leg portion $L_1$ of the leads L during the reforming operation and therefore define with the surfaces $A_v$ and $A_h$, the reforming surfaces.

The next step in the reconditioning process after oscillation of the leads L, is to reform the J-shaped terminal end portions of the leads L and reestablish coplanarity and stand off height H of the opposing rows of leads $R_1$ and $R_2$. To this end, the pressure of the anvil A against the PLCC parts P is reduced to permit sliding movement of the anvil A with respect to the trackway $T_b$ during the reforming operation schematically illustrated in FIG. 6L and 6M. The anvil A is first moved in one direction transverse to the trackway $T_b$ to the right as shown in FIG. 6L whereby the leads L in row $R_1$ are reformed and made coplanar by engagement with the reforming recesses $A_R$ in the anvil A and reforming surfaces 2 15 of the comb C. It is noted at the end of the anvil stroke to the fight, that the pressure is again increased for the final reforming of the lead J portion. After a short dwell, the pressure is again lowered and the anvil A is reciprocated transversely in the opposite direction to the left as shown in FIG. 6M to reform and reestablish coplanarity of the leads L of row $R_2$, the pressure again being increased at the terminus of the anvil stroke for final reforming. The anvil is then returned to its "home" center position spaced above the PLCC part P as shown in FIG. 6N after the pressure is reduced to zero (0).

It is noted that reforming leads L in accordance with the present invention reestablishes the minimum H dimension for all deformed leads which including leads L wherein the peaks $L_p$ are below the minimum H (See FIG. 6L) as well as leads L having peaks $L_p$ above the minimum H dimension. Thus, as illustrated in FIG. 6M, the throat portion 215 of the comb assemblies C engages the leg $L_1$ of the lead L and serves as a fixed backup or support as the anvil A is moved laterally towards the comb assembly C during the reforming cycle thereby confining the J portion of the lead L to engage the reforming surface $A_r$ of the anvil A thereby causing the peaks $L_p$ of all the leads L to engage the reforming surface $A_h$ setting the minimum H dimension to proper stand off and coplanarity specifications.

At this juncture, the rows of leads $R_1$ and $R_2$ have been reconditioned and made coplanar and the PLCC part P exits the first Straightening Station $S_{s-1}$. The PLCC part P now needs to be rotated 90° to recondition the leads in opposing rows $R_3$ and $R_4$. Accordingly, with the parts in the position shown in FIG. 6N, the part locator $P_L$ is lowered and whereby the PLCC part P moves by gravity down the trackway to a Rotation Station $S_r$.

A PLCC part P enters the Rotation Station $S_r$ linearly on the trackway T, to a turntable which rotates the PLCC part P 90° and automatically discharges it to the trackway T where it moves by gravity to the Second Straightening Station $S_{s-2}$ to recondition the leads in Rows $R_3$ and $R_4$ in the same manner as at the first Straightening Station $S_{s-1}$.

Finally, when reconditioning and coplanarity of all the leads has been completed, the fully reconditioned PLCC part P is discharged at a Discharge Station $S_d$ for collection into cartridges.

Having considered the apparatus and system of the present invention in broad detail and having described some of the components of the system in terms of broad function, consider now the specific the structural details and arrangement of the components. Starting first with the Singulating Station $S_{s-1}$, the trackway T at the entrance end of the apparatus comprises an elongated rectangular bed plate 10 forming the bed of the trackway T on which the PLCC parts P ride. Bed plate 10 is mounted on the face plate 12 of a housing 14. A pair of elongated rails 16 and 18 are mounted on bed plate 10 and have confronting faces 16A and 18A defining trackway T or channel 20. The confronting faces 16A and 16B of the rails 16 and 18 are of inverted L-shaped configuration to define the channel 20 which loosely confines the PLCC parts P in the manner shown in FIG. 7.

A restrike plate 24 is mounted in a cavity 26 in the rail 18. The restrike plate 24 is mounted for reciprocating movement transverse to the trackway T by air cylinder 28 mounted in a housing 30 secured to the rail 18 so that both air cylinder 28 and restrike plate 24 move in conjunction with the rail 18. Thus, the width of the trackway T can be adjusted or varied by moving the rails 16 and 18. The restrike plate has an elongated hammer portion $24^a$. The face of the hammer $24^a$ is preferably of a greater length than the largest side dimension of the PLCC part P. The restrike plate 24 functions to squeeze rows $R_1$ and $R_2$ of each PLCC part P as it enters the Singulating Station $S_s$ to ensure friction free flow of the PLCC part P along the trackway T in a manner to be described more specifically hereinafter. Note that the restrike plate 24 spans a pair of PLCC parts P ensure compression of all the leads and to accommodate PLCC parts P of different dimensions and lengths.

Figure 7:
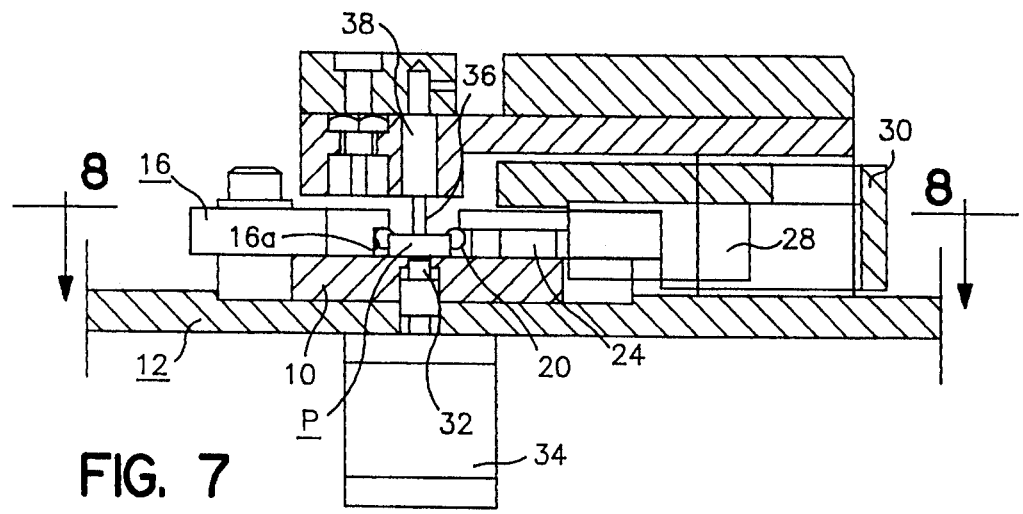
FIG. 7 is an enlarged fragmentary sectional view taken on lines 7—7 of FIG. 3 showing certain details of the Singulating Station.

The Singulating Station $S_s$ also includes means for selectively feeding the PLCC parts P one at a time. To this end, a stop pin 32 aligned with the center line of the trackway T is actuatable between extended and retracted positions by means of an air cylinder 34 mounted below the cover base plate 12. FIG. 7 shows the stop pin 32 in a retracted limit position thus permitting discharge of a PLCC part P from the Singulating Station $S_s$. A hold down pin 36 under the control of an air cylinder 38 is mounted in a sensor housing overlying the trackway T cantilevered to the cover base plate 30 to support the hold down pin 36 in a fixed position aligned with the center of the trackway T. It is noted that the hold down pin 36 is centered even during adjusting movements of the rails 16 and 18 to vary the width of trackway T. As illustrated, the hold down pin 36 is spaced rearwardly of the stop pin 32 and is normally in a lowered position when the stop pin 32 is in a retracted limited position so that only one PLCC part P at a time is released from the Singulating Station $S_s$. In other words, the hold down pin 32 is positioned to engage the second PLCC part P in a stream of parts P located at the Singulating Station $S_s$. Of course, the pin 32 in a raised position serves to hold all PLCC parts P upstream of the pin 32 in the Singulating Station $S_s$. Sensor means $S_9$ located between the stop pin 32 and the hold down pin 36 is provided to detect the presence or absence of a PLCC part P at the discharge position of the Singulating Station $S_s$.

Consider now briefly, operation of the system therefore described and with particular reference to FIGS. 2, 3, 7 and 8, a cartridge C filled with PLCC parts P is mounted at the entrance end of the trackway T so that the PLCC part P flows by gravity from the cartridge to the Singulating Station $S_s$. It is noted that the stop pin 32 is in a raised position so that PLCC parts P accumulate in the Singulating Station $S_s$ in the manner shown in FIG. 8. Sensor $S_9$ senses the presence of a PLCC part P at the Singulating Station $S_s$ and initiates a cycle of the restrike plate 24 to bend inwardly any grossly bent leads L to ensure smooth trouble free passage of the PLCC part P through the channel 20 of the trackway T as shown in FIG. 7. In other words, the restrike plate 24 squeezes the leads L in opposing rows $R_1$ and $R_2$ to a degree where the PLCC part P will flow freely through the channel 20. When the restrike plate 24 completes its cycle, the system activates the hold down pin 36 to engage the second PLCC part P in line and simultaneously effect actuation of the air cylinder 34 to retract the stop pin 32 to its lower limit position, thereby releasing the first PLCC part P at the discharge position. When the first PLCC part P discharges the Singulating Station $S_s$, the stop pin 32 is again raised and the hold down pin 36 is released to permit the stream to move downwardly one notch against the stop pin 32. The cycle is completed by the hold down pin 36 reengaging the second PLCC part P in line. The two spaced sensors $S_1$ and $S_2$ located at the entrance end of the Singulating Station $S_s$ sense the absence of PLCC part P indicating the cartridge is empty and signalling delivery of another filled cartridge to the entrance of trackway T from the automatic feeding device F (See FIG. 2). Since the PLCC parts P have leads L on all four sides, the two sensors $S_1$ and $S_2$ prevent accidental signalling of absence of PLCC parts P which may be the case with a single sensor sensing the open space created by the leads L between two adjacent PLCC parts P.

Figure 9:
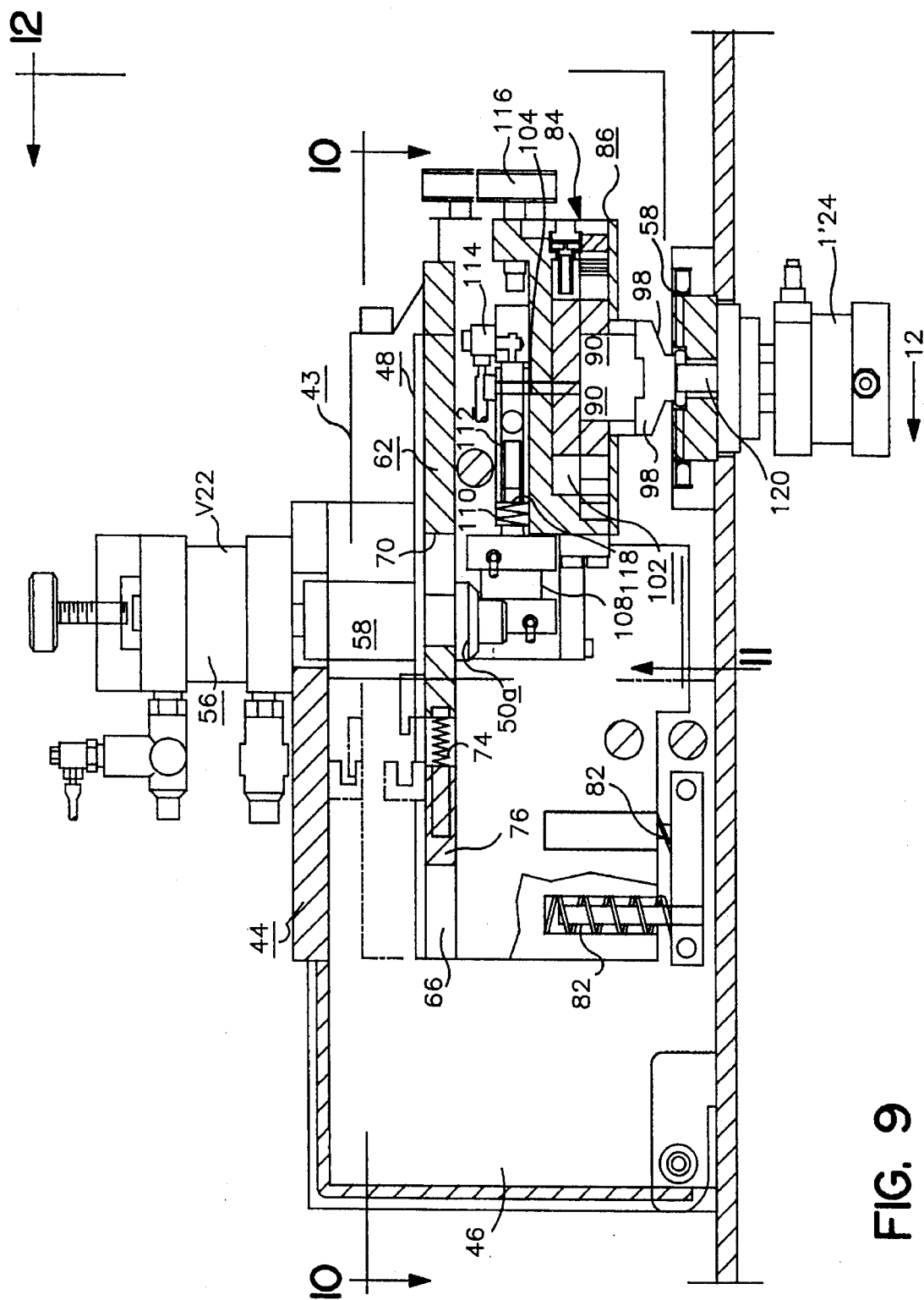
FIG. 9 is an enlarged transverse sectional view taken on lines 9—9 of FIG. 3 showing certain details of the Corner Treatment Station.
Figure 10:
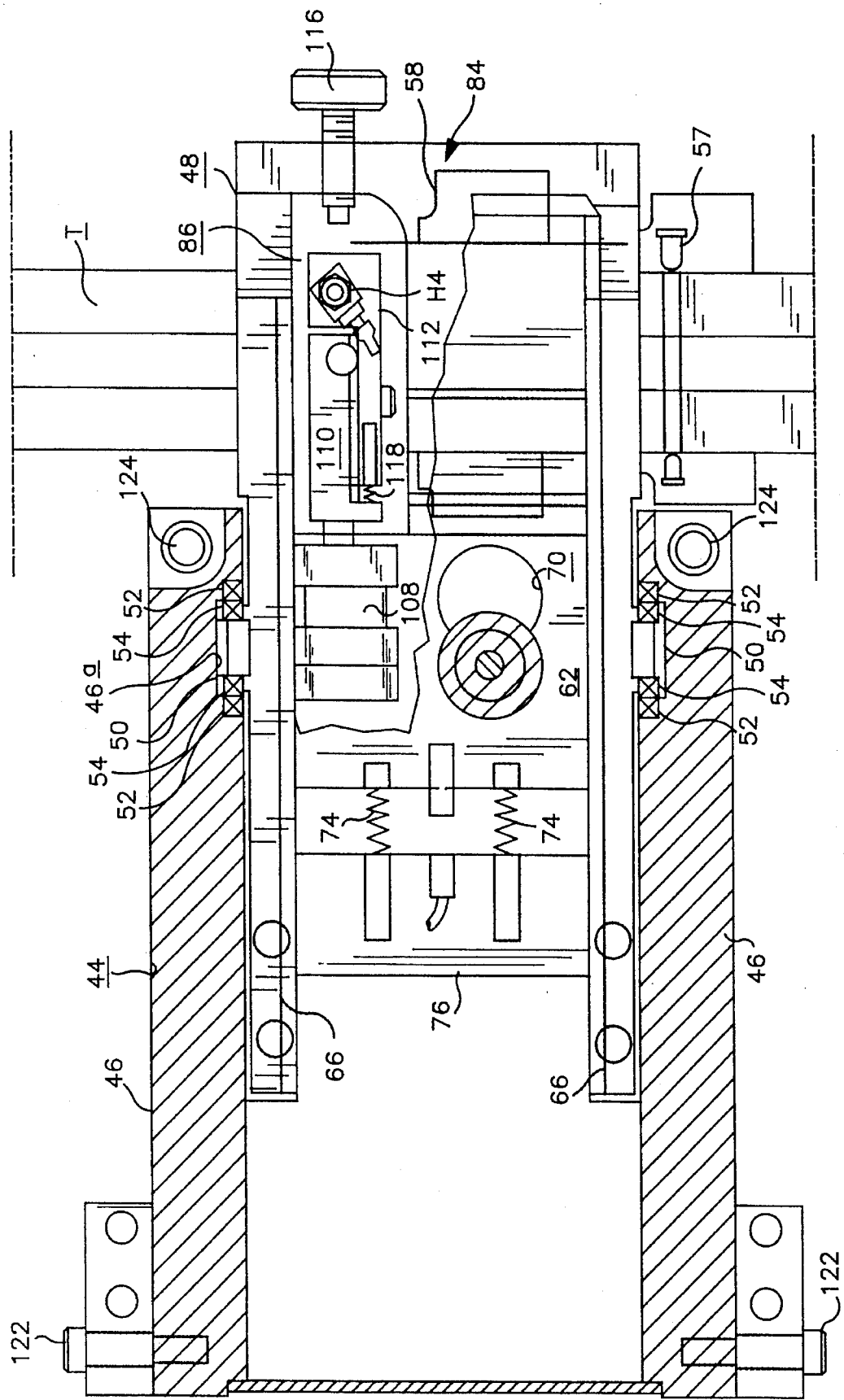
FIG. 10 is a fragmentary sectional plan view taken on lines 10—10 of FIG. 9.
Figure 11:
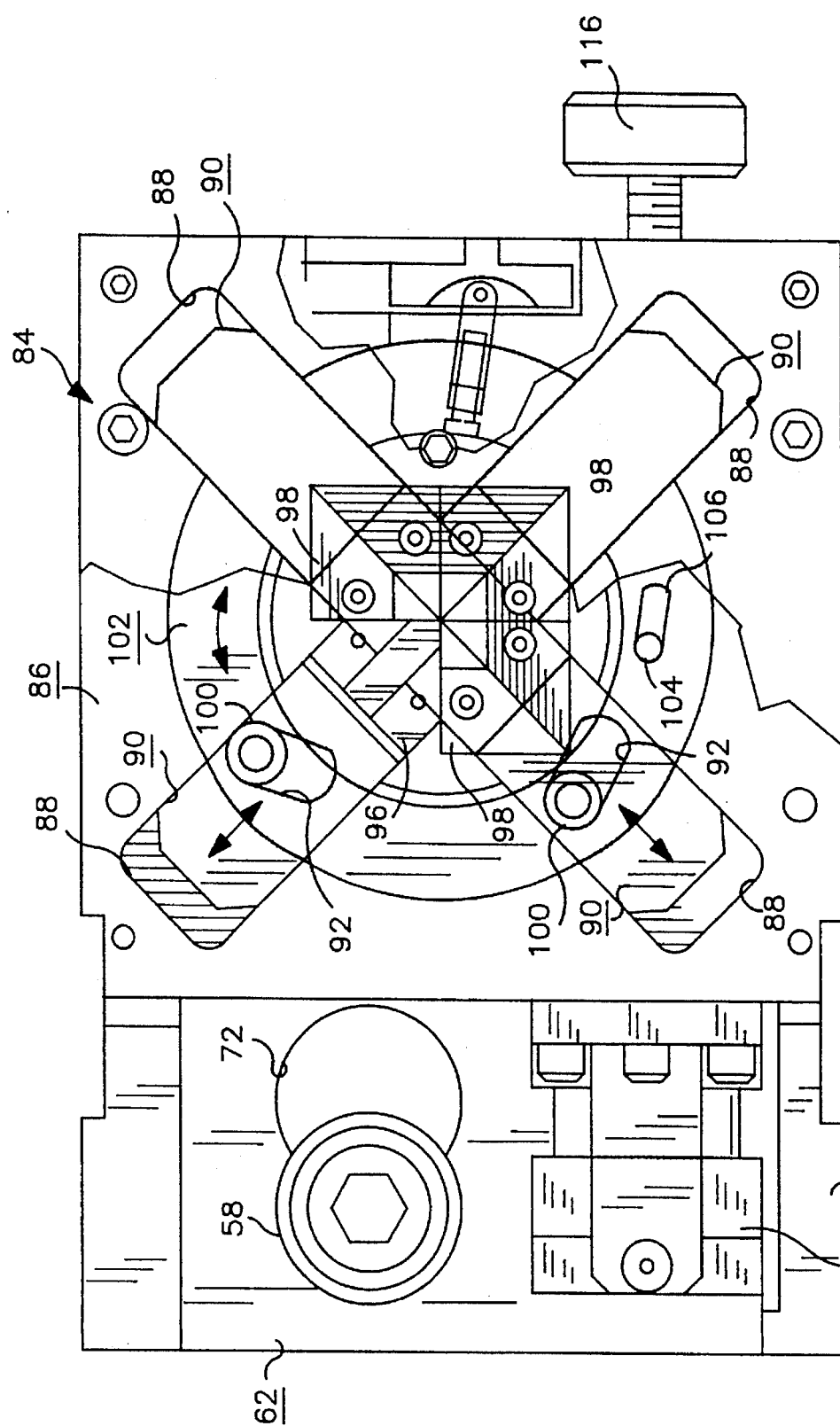
FIG. 11 is an enlarged fragmentary bottom plan view taken on lines 11—11 of FIG. showing details of the forming dies and related mechanisms.
Figure 12:
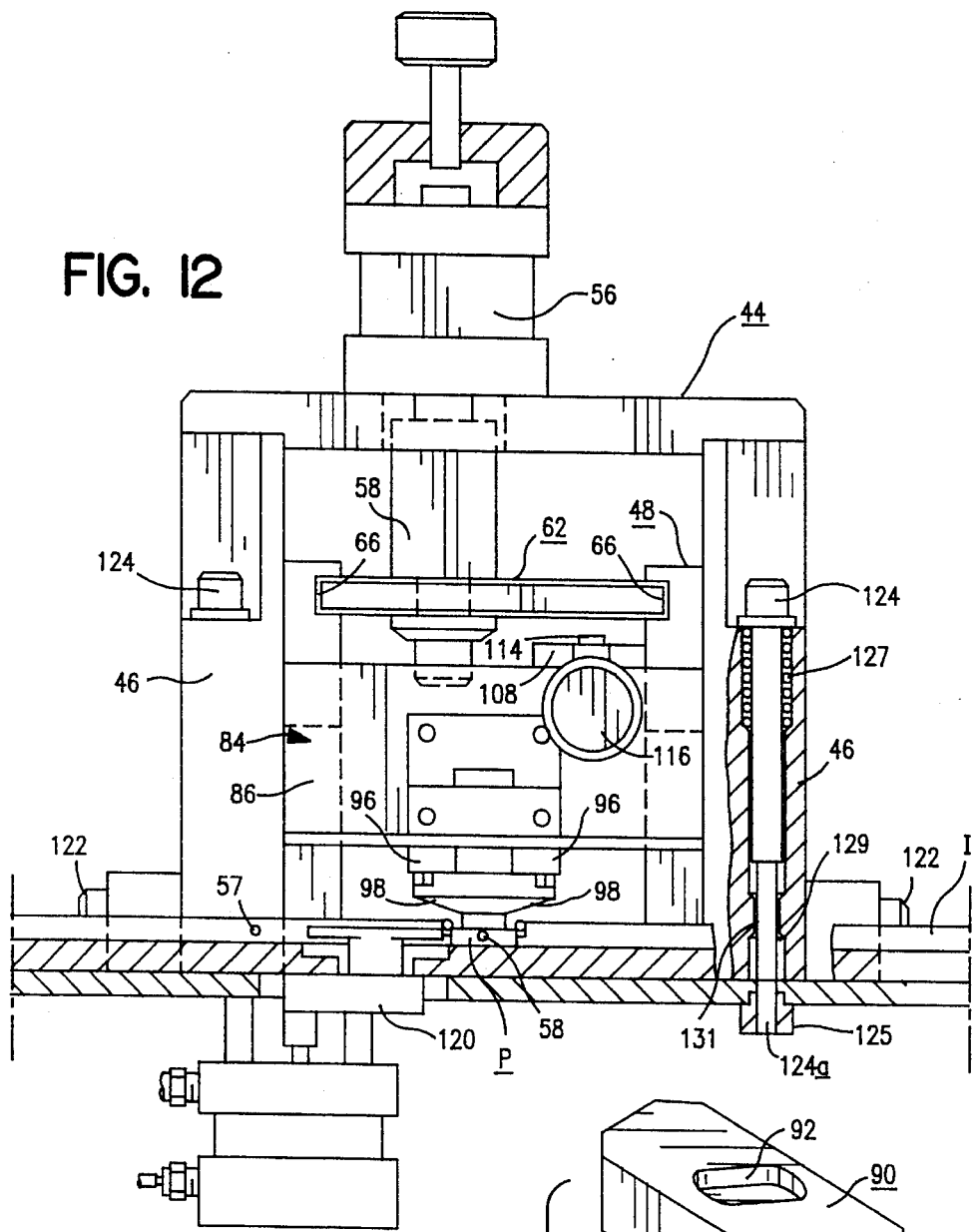
FIG. 12 is a stepped sectional elevational view taken along stepped lines 12—12 of FIG. 9.
Figure 13:
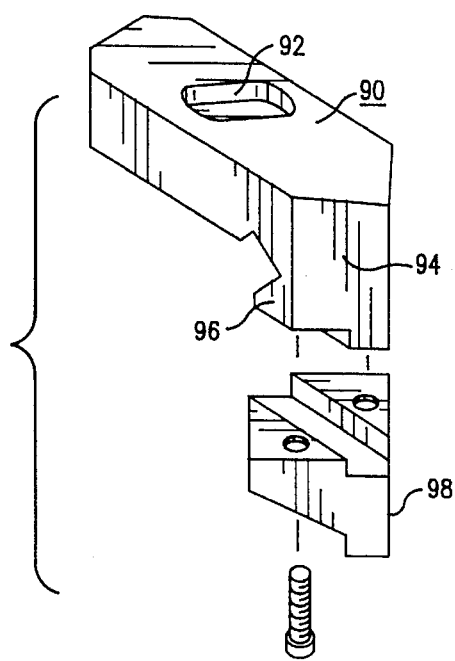
FIG. 13 is an exploded isometric view showing some of the elements of the Corner Treatment Station including a slide and cam track and one of the forming dies.

A PLCC part P discharged from the Singulating Station $S_s$ enters the Corner Treatment Station $S_{cr}$. The details and arrangement of the Corner Treatment Station $S_{cr}$ are best illustration in FIGS. 9–13 inclusive. An upstanding block housing 44 having a pair of spaced upstanding sidewalls 46, 46 extends transversely of the trackway T and is pivotally mounted to the main deck 12 to facilitate actuation between a raised position completely exposing the trackway T permitting access to the trackway and an operative position overlying the trackway T (see FIGS. 9 and 10).

A slide assembly or carriage 48 is mounted between the sidewalls 46, 46 of the housing 44 for vertical adjusting movement. More specifically, the sidewalls 46 have confronting guideways 50 in their opposing innerfaces $46^a$ mounting linear bearings 52 cooperatively associated with linear bearings 54 carried by the slide assembly 48. The slide assembly 48 is moved vertically relative to the guide block housing 44 by an air cylinder 56 supported in the top of the block housing 44 having an actuator 58 which mounts a latch plate 62 connected to the vertical slide assembly 48 in the manner shown in FIGS. 9 and 12. The latch plate 62 extends between the upstanding vertical sidewalls 46 of the slide assembly 48 and slidingly engages in confronting opposing grooves 66. The latch plate 62 has a keyhole slot 70 for selectively connecting the slide assembly 48 to the actuator 58. For example, in the locked or working position illustrated in FIG. 10, the keyhole slot 70 embraces the actuator 58 so that the latch plate 62 and slide assembly 48 move up and down in response to the double acting air cylinder 56. Latch plate 62 is normally spring biased to this operating position by springs 74 extending between the latch plate 62 and a fixed base plate 76. When it is desired to disengage the slide assembly 48 from the actuator 58, the latch plate 62 is pushed rearwardly against the bias of the springs 74 whereby the large diameter opening $70^a$ of the keyhole slot 70 is vertically aligned with the head portion 58A of the actuator 58. In this position, the slide assembly 48 is raised upwardly by spring actuators 82 to the dot and dash position shown in FIG. 9 which permits access to the trackway T for correcting problems that may occur at the Corner Treatment Station $S_{cr}$. The slide assembly 48 is in a raised position to facilitate initial set-up of various components of the Corner Treatment Station $S_{cr}$ such as sensors and other elements to be described.

A forming assembly or die mechanism broadly designated by the numeral 84 is supported between the vertical sidewalls 46, 46 of the slide assembly 48 overlying trackway T and comprises an actuator housing 86 of generally square block-like shape. The block housing 86 is moved vertically upon actuation of the slide assembly 48 in the manner described above between operative and raised positions described previously. The lower face of the block housing 86 has formed therein a series of four generally rectangular guideways 88 into which fit four (4) cam activated slide blocks 90, each having cam slots 92 machined in their upper faces, inner terminal end walls of triangular shape 94 and an alignment boss 96 for mounting the corner forming dies 98 (See FIG. 13). The dies are removably mounted to the slide 90 to facilitate changeover for different PLCC parts P.

The dies 98 are actuatable as a unit from an inner, nested position wherein they are completely disposed within a square or rectangle defined by the inner projections of the leads L of the rows $R_1$, $R_2$, $R_3$, and $R_4$ to an outer limit position (See FIGS. 6c and 6d) to initially reform the leads L to accommodate the pad $A_p$ of the anvil A.

To this end, each of the slides 90 has a cam slot 92 formed therein which is angularly disposed at an angle to the longitudinal axis A—A of the slide. Four Cam roller trunnions 100 are mounted on a cam ring 102 at circumferentially equi-spaced locations. The cam ring 102 mounts a pin 104 which engages in a slot 106 to limit rotation of the cam ring 102 in a manner describer hereafter.

Means is provided for selectively actuating the cam ring 102 to effect predetermined displacement of the dies 98 between inner and outer limit positions. The actuating means includes adjustment means so that the limit positions may be selectively varied for PLCC parts P of different dimensions. To this end, the actuator system shown in FIG. 10 includes an air cylinder 108, an actuator 110, a clevis 112 which mounts a pitot air supplied block 114 defining a stop and a sensor which in turn is cooperatively associated with an adjustable stop sensing screw 116.

Consider now briefly a typical operational cycle at the Corner Treatment Station $S_{cr}$. A PLCC part P discharged from the Singulating Station $S_s$ passes down the trackway T by gravity to the Corner Treatment Station $S_{cr}$ and engages a part locator stop 120. Sensor $S_8$ senses presence of a PLCC part P at the station and initiates cycling of the die mechanism 84. More specifically, air cylinder 56 is activated to lower vertical slide assembly 48 to its lower limit position which positions the dies 98 in a cluster against the PLCC part P interiorly of the array of leads L referred to herein as the inner nested position of the dies. Air cylinder 108 then moves clevis 112 outwardly and block 114 toward the adjustable stop sensor screw 116. This action in turn rotates cam ring 102 and through cam slots 100 and slides 90 moves the dies 98 radially outwardly towards the leads L (See FIG. 6d). When the stop sensor 114 engages adjusting screw 116, it closes the gap against the bias of the spring 118 and this determines the outer open limit position of the dies 98 and signals reversal of the air cylinder 108 to retract the dies 98 to the inner, nested position shown in FIG. 6C and FIG. 11. When the dies 98 close, the slide assembly 48 is raised and the logic circuit then triggers retraction of the part locator pin 120 to permit the processed PLCC part P to exit the Corner Treatment Station $S_{cr}$ (See FIG. 6e). As the PLCC part P exits the station, sensor $S_7$ signals the logic circuit to feed the next PLCC part P to the Corner Treatment Station $S_{cr}$.

The Corner Treatment Station housing 44 is pivotly mounted to the deck 12 by shouldered pivot screws 122. The housing 44 is normally held in an operative fixed position by hold-down bolts 124 located at the corners of the housing remote from the pivots 122. Note that the hold-down bolts 124 are spring biased. The hold-down bolts 124 are of a self-retaining design including an enlarged threaded outer terminal shank portion 124A which engages in an internally threaded nut 125. Accordingly, when it is desired to release the housing 44, the head of the bolt 124 is turned to unscrew the bolt from the nut 125 and when the threaded terminal end 126 is screwed to a given point, the spring 127 raises the bolt 124 upwardly until the enlarged lower shank portion $124^a$ engages the restricted aperture 129 in the housing. Accordingly, the bolt assembly engages the shoulder 131 in the housing 44 to retain the bolt and spring with the housing when it is pivoted to an upside down raised or open position.

A PLCC part P leaving the Corner Treatment Station $S_{cr}$ moves down the trackway T to the first Straightening Station $S_{s-1}$, and is positioned properly for a straightening operation by engaging a part locator 128. The locator pin 128 positions the PLCC part P relative to the anvil A so that the projecting pad $A_p$ nose of the anvil A engages the body portion B interiorly of the leads L as shown in FIG. 6C. Sensor $S_5$ senses the PLCC part P in a ready position and initiates a straightening cycle in a manner described previously.

Figure 14:
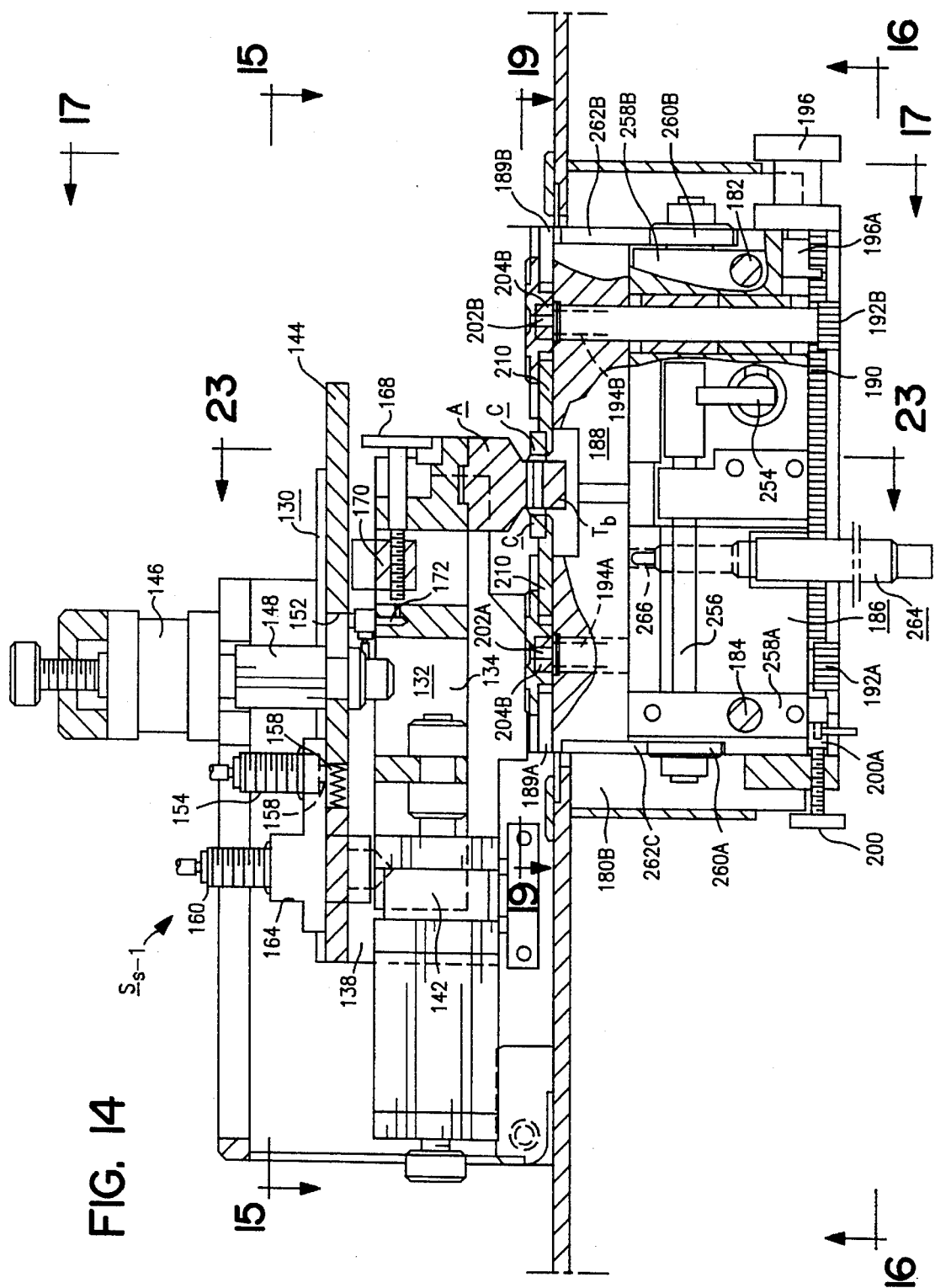
FIG. 14 is an enlarged transverse sectional elevational view taken on lines 14—14 of FIG. 3 showing some of the actuating mechanisms for the first Straightening and Reconditioning Station.
Figure 23:
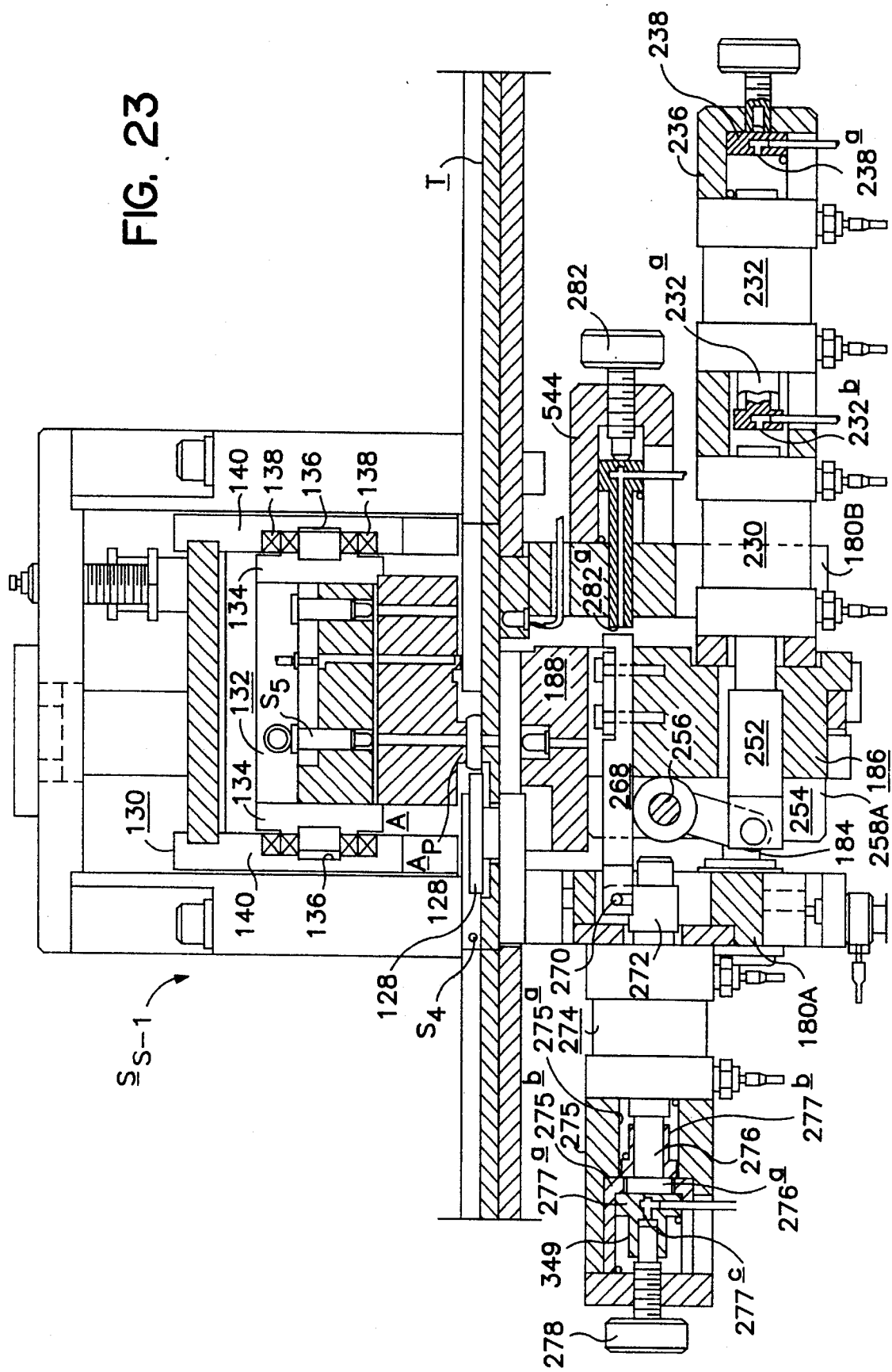
FIG. 23 is an enlarged fragmentary elevational view taken on lines 23—23 of FIG. 14 showing additional components and details of parts of the apparatus at the Straightening and Reconditioning Station.

Consider now the mechanisms for compound movements of the anvil A, in horizontal and vertical directions relative to trackway T. The anvil A is connected on opposite sides to a pair of spaced horizontal slide assemblies 134 which in turn engage in ways 136 defined by linear bearing 128 mounted in spaced vertical slide assemblies 140. As illustrated in FIGS. 14 and 23, the horizontal slide assembly 132 is activated by a self-centering air cylinder 142 and the vertical slide assemblies 130 are connected by a locking plate 144 in turn connected to an air cylinder 146.

The anvil mounting assembly includes means for selectively raising the anvil A to a predetermined height above the trackway T for better access to that region for set up and adjustments and any operational problems. To this end, the locking plate 144 can be moved to the left with respect to FIG. 14 against the bias of spring 150 to align the actuator 148 with an enlarged opening 152 in the plate 144 and thereby permit the entire anvil assembly A to be elevated relative to the actuator assembly 148 which is fixed.

Figure 18:
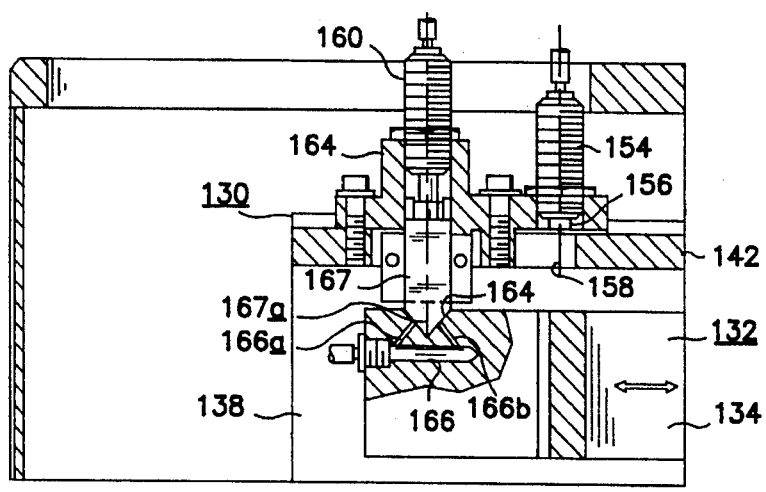
FIG. 18 is an enlarged fragmentary sectional elevational view taken on lines 18—18 of FIG. 15 showing some of the mechanisms for recentering and interlocking the anvil carriage.
Figure 19:
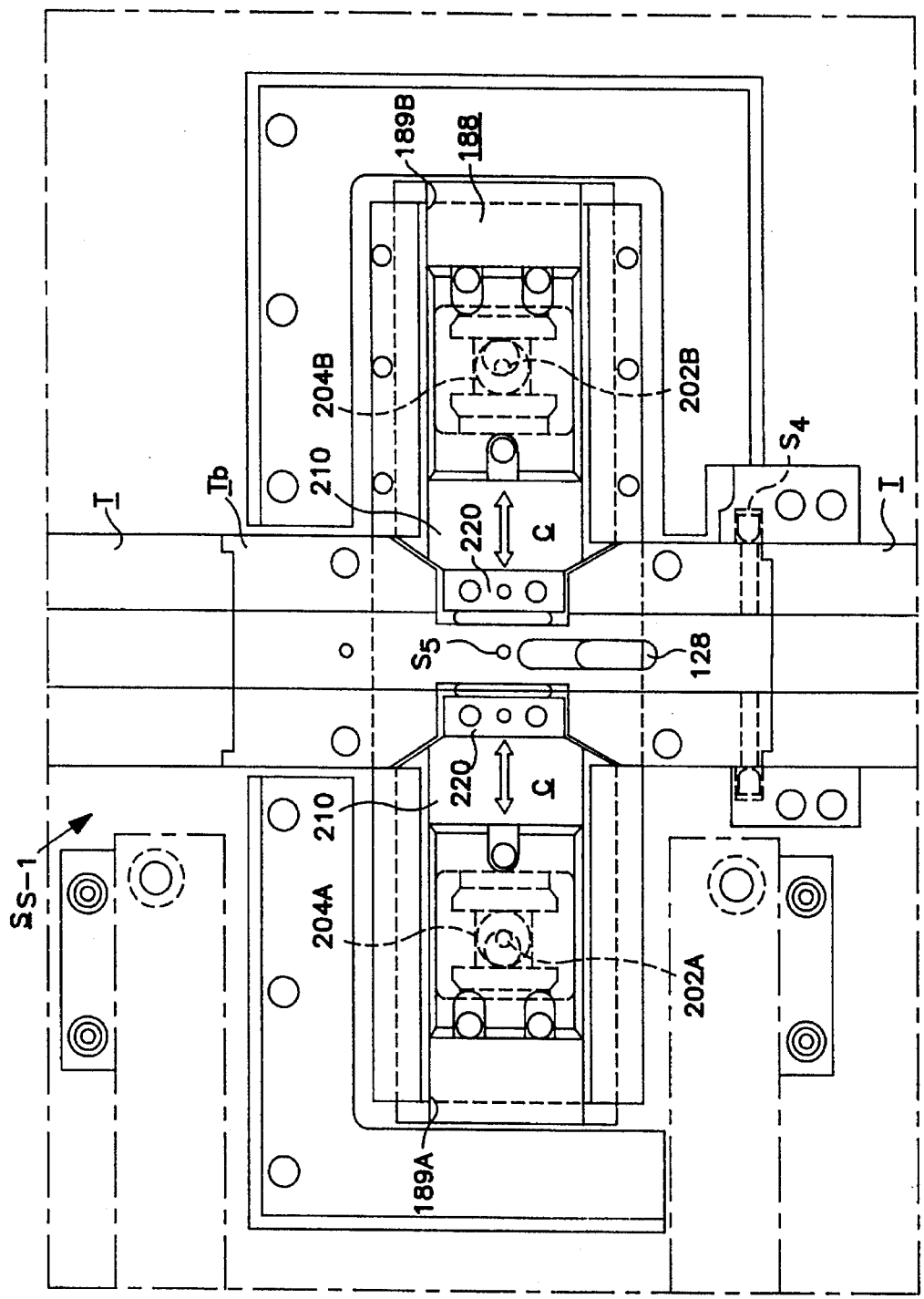
FIG. 19 is an enlarged fragmentary sectional plan view showing some of the details of the bridge track and the comb assemblies of the Straightening and Reconditioning Station.

A safety device is provided for preventing actuation of the locking plate 144 to the left when air pressure is on in the system. To this end, air cylinder 154 has a locking pin 156 normally engaging in an opening 158 forming the chamber for springs 150. Air pressure normally biases the pin 156 downwardly to a locked position for the locking plate 144. Release of air pressure raises the pin 156 permitting displacement of the locking plate 144 to permit elevation of the entire anvil assembly 130 to a raised position (See FIG. 18).

Figure 8:
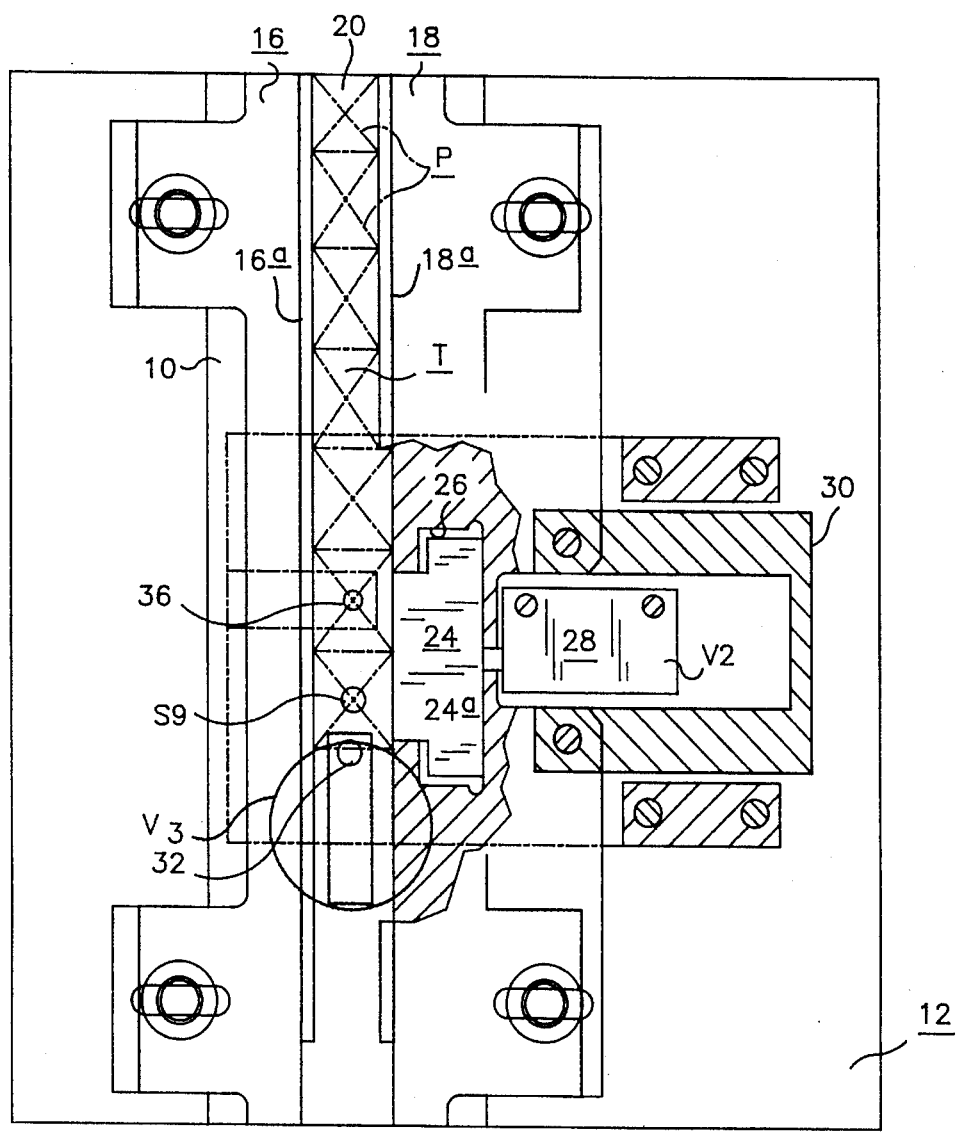
FIG. 8 is fragmentary plan view taken on lines 8—8 of FIG. 7.
Figure 15:
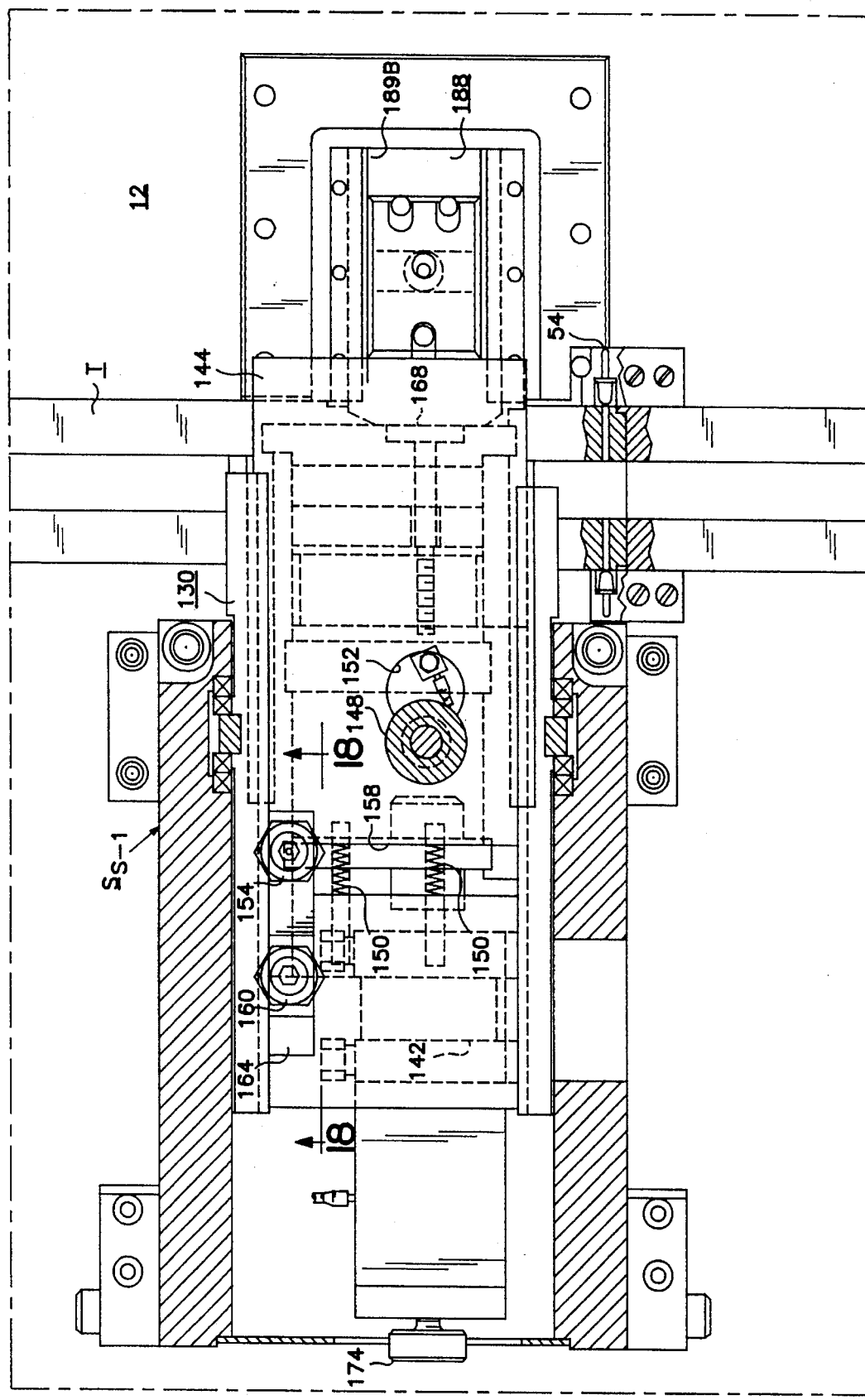
FIG. 15 is a sectional plan view taken on lines 15—15 of FIG. 14.
Figure 16:
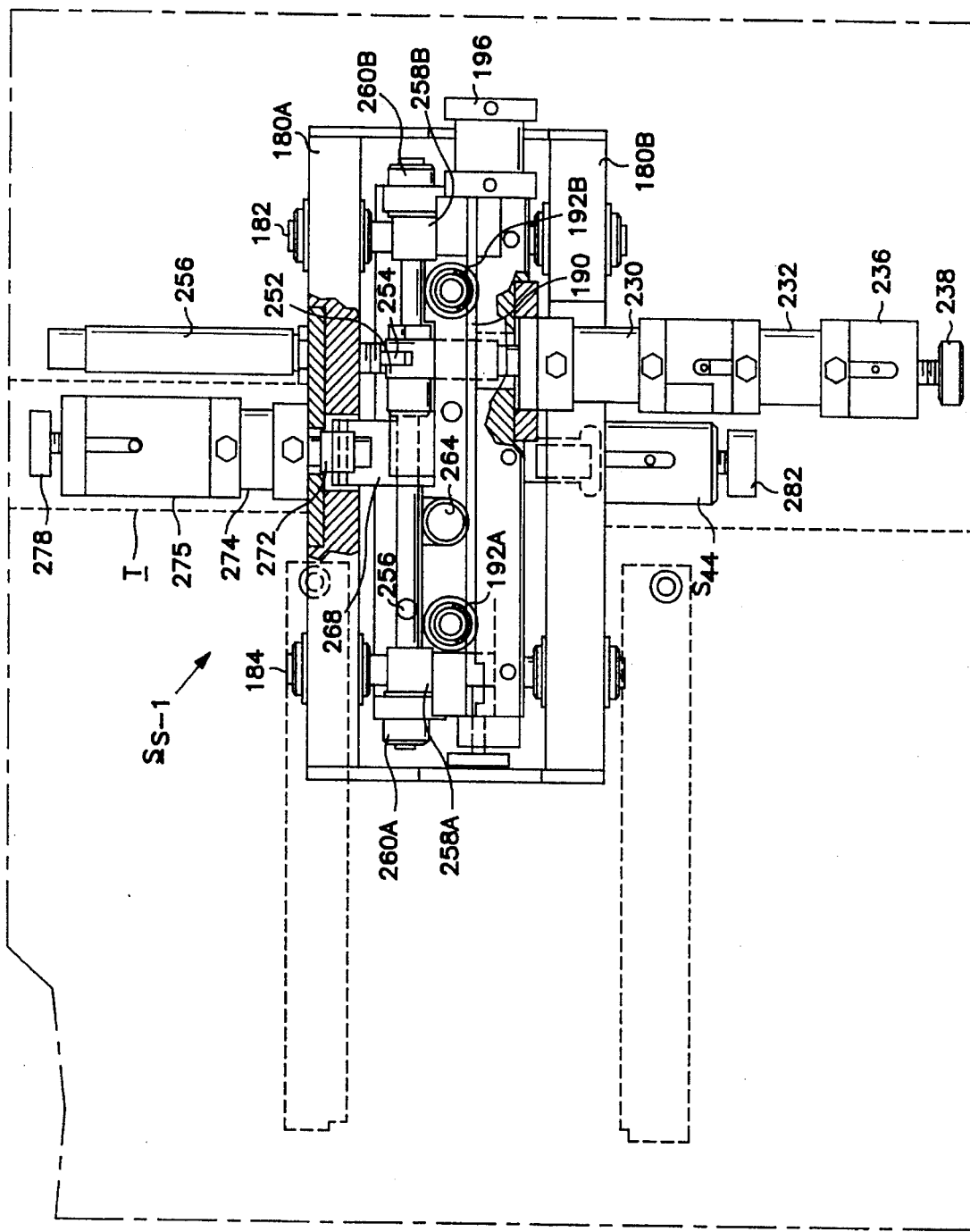
FIG. 16 is a sectional bottom plan view taken on lines 16—16 of FIG. 14.

Another feature of the anvil mounting and actuating mechanism is means for truly centering the anvil A relative to the PLCC part P at the Straightening Station $S_{s-1}$, which is important to eliminate possible damage to the leads L which are spaced closely to the periphery of the pad portion $A_p$ of the anvil A. During recurling and coplanarity conditioning of the leads, the horizontal slide assembly 132 is activated to the right of center, then to the left of center and then returns the anvil A to a precise center position. To insure actuation in this manner, sensing and interlocking means is provided comprising an air cylinder 160 mounted in a housing 164 which is secured to the vertical slide assembly 130 as shown in FIGS. 14, 15 and 8. The actuator 162 of air cylinder 160 is rectangular in cross section and has a triangular shaped tip $162^a$ that projects into and perfectly seats within a corresponding triangular shaped notch 164 formed in the horizontal slide assembly arm 134 as shown in the FIGS. 14 and 18. An air sensing inlet manifold 166 is provided on the terminal end of an arm 134 of the horizontal slide carriage 132 and air is provided to two diagonally opposed ports $166^a$ and $166^b$ from manifold 166. When the horizontal slide assembly 132 has exactly centered the anvil A with respect to the trackway longitudinal centerline, the tip $162^a$ of actuator 162 completely shuts off air from both ports $166^a$ and $166^b$ and insures that the anvil A is centered. This interlocking and sensing means of the horizontal slide assembly 132 and the vertical slide assembly 130 is maintained until the recurling phase is initiated when the actuator 162 is retracted from the notch 164. It is noted that these passages are connected to the central air pressure supply system and to the logic system of the machine so that when the anvil A is truly centered, both passages are blocked and the actuator 164 does not seat properly and the anvil can then be cycled. If air is leaking through either passage, this signals that the anvil A is not centered and prevents operation and cycling of the anvil A in turn which prevents a straightening cycle from being initiated since it would cause damage to part of the machine. Accordingly, this provides backup ensuring precise positioning of the anvil A in addition to the self-centering air cylinder 142 (See FIG. 15).

Means is provided for selectively varying the left of center and right of center displacement of the anvil A during the recurling cycle. To this end, there is provided a first adjustment screw 168 having a threaded shank 168 engaging in a bracket 170 mounted on the vertical slide assembly 130. The axial end of the threaded shank $168^a$ fronts an air passage 172 located in a rib $130^a$ of the horizontal slide assembly 130. The unthreaded shank portion $168^a$ of the screw 168 engages through an enlarged opening in the anvil A. The self-centering air cylinder 142 has a similar internal adjustment screw 174. Accordingly, when the recurling cycle is initiated, the anvil A is first moved in one direction, for example, to the right relative to FIG. 14 until screw 168 closes air passageway 172. This signals reversal of the anvil A through air cylinder 142 to move the anvil A to the left of center until the screw 174 closes air passageway 172. Air cylinder 142 is the same design of air cylinder 274 shown in detail in FIG. 23.

When the anvil is recentered, air cylinder 160 displaces actuator 162 downwardly to close air passages $166^a$ and

168$^b$ locking the anvil A in the center position. When the anvil A is centered in the trackway T in the manner described above, the parts are in position to initiate the oscillation cycle and the comb assemblies are initially in the position shown in FIG. 6G.

The mechanisms for the complex movement of the comb assemblies during the straightening and oscillating cycle are best shown in FIGS. 14, 16, 19 and 23. The mechanisms include a pair of spaced blocks 180$^a$ and 180$^a$ depending from the bottom side and attached to the base plate 12. The blocks 180$^a$ and 180$_b$ mount two (2) stubshafts 182 and 184 which carry a central block 186 and a comb carriage block 188 (See FIG. 23). As noted above, initially at the start of the cycle, the combs C are in the lower or home position as shown in FIG. 6G. The mechanism for moving the combs C in and out are best illustrated in FIG. 14 and include an elongated toothed rack 190 mounted on the lower end of the central block 186 and a pair of spaced spur gears 192$^a$ and 192$^b$ which rotate shafts 194$^a$ and 194$^b$ connected to the comb assemblies C. The rack 190 is moved left and right by an air cylinder 196 having an actuator 196$^a$ keyed to the rack 190 (See FIG. 14). Sensing means is provided for determining the travel of the rack 190 consisting of an adjustable screw 200 and air sensor 200$^a$ connected to the central system. When the rack 190 travels to the left to block the sensor 200$^a$ the next operation in the straightening cycle is initiated. The air sensor 200$^a$ determines the "out" limit positions of the combs C.

The shafts 194$^a$ and 194$^b$ mount eccentric pins 200$^a$ and 200$^b$ at their axial ends remote from the gears 192A and 192B which engage in shoes 204$^a$ and 204$^b$ in the comb slide assemblies C. Accordingly as the spur gears 192$^a$ and 192$^b$ rotate, the shafts 194$^a$ and 194$^b$ rotate the pins 202$^a$ and 202$^b$ around the centers of the shaft 194$^a$ and 194$^b$ to effect linear movement of the comb slide assemblies C in their guides 189$^a$ and 189$^b$ in comb carriage block 188. Each slide assembly as best illustrated in FIGS. 19–22, comprise a slide block 210 having a cut-out along its front edge, defining a shelf 212 mounting an elongated comb blade 214.

The comb blade 214 has a series of equi-spaced teeth 216 of a rectangular cross section terminating in blunt tips of diamond shaped cross section. The comb body 214 between adjacent teeth or fingers 216 is referred to herein as the root or throat 215 and functions with the forming recess $A_r$ in the anvil A as a reforming surface during the reforming cycle described previously. Also described previously, the coplanarity and stand off height H are restored by the reforming action of the reforming surfaces $A_r$ and 215 on the transverse movement of the anvil A during a reforming cycle. The comb blade 214 and associated forming block 220 attached to the comb slide 2 10 by screws 222.

Figure 5:
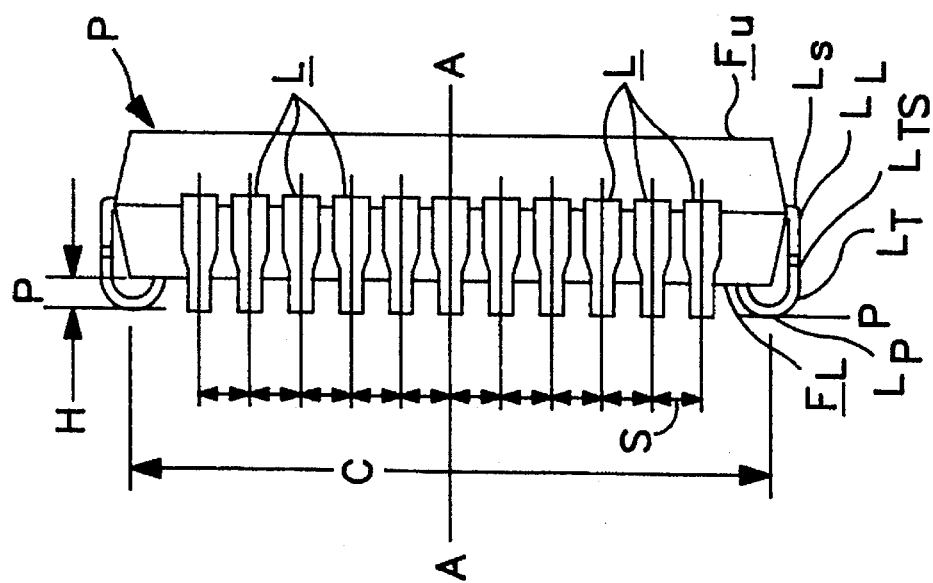
FIG. 5 is a side elevational view of the PLCC part shown in FIG. 4 illustrating additional details of the geometry and spacing of the J-shaped leads.

The comb teeth 216 are designed to travel between the leads of the PLCC part P, with reference to FIG. 5 it can be seen that the width W from the shoulder of the lead L to approximately the mid length of the lead is wider than the remaining portion that includes the curled end. The comb teeth at fingers 216 are designed to accommodate this difference in width. To this end, each tooth 216 has a main body portion 216$^a$ of square cross section for approximately 2/3 the length of the tooth, the remaining 1/3 length being of a slightly narrowed width $W_L$ but of the same thickness as the main body portion forming a shoulder 216$^b$. The tooth 216 is still of generally square cross section frown this shoulder to the outer most face of the tooth thus, there is a cross sectional transition from a square cross section to a diamond creating triangular facets 216$^c$ and 216$^d$ to from shoulder to the tip. This narrowed faceted tip is the portion of the comb tooth which passes between the leads L from their shoulder to approximately 1/2 lead length.

Figure 17:
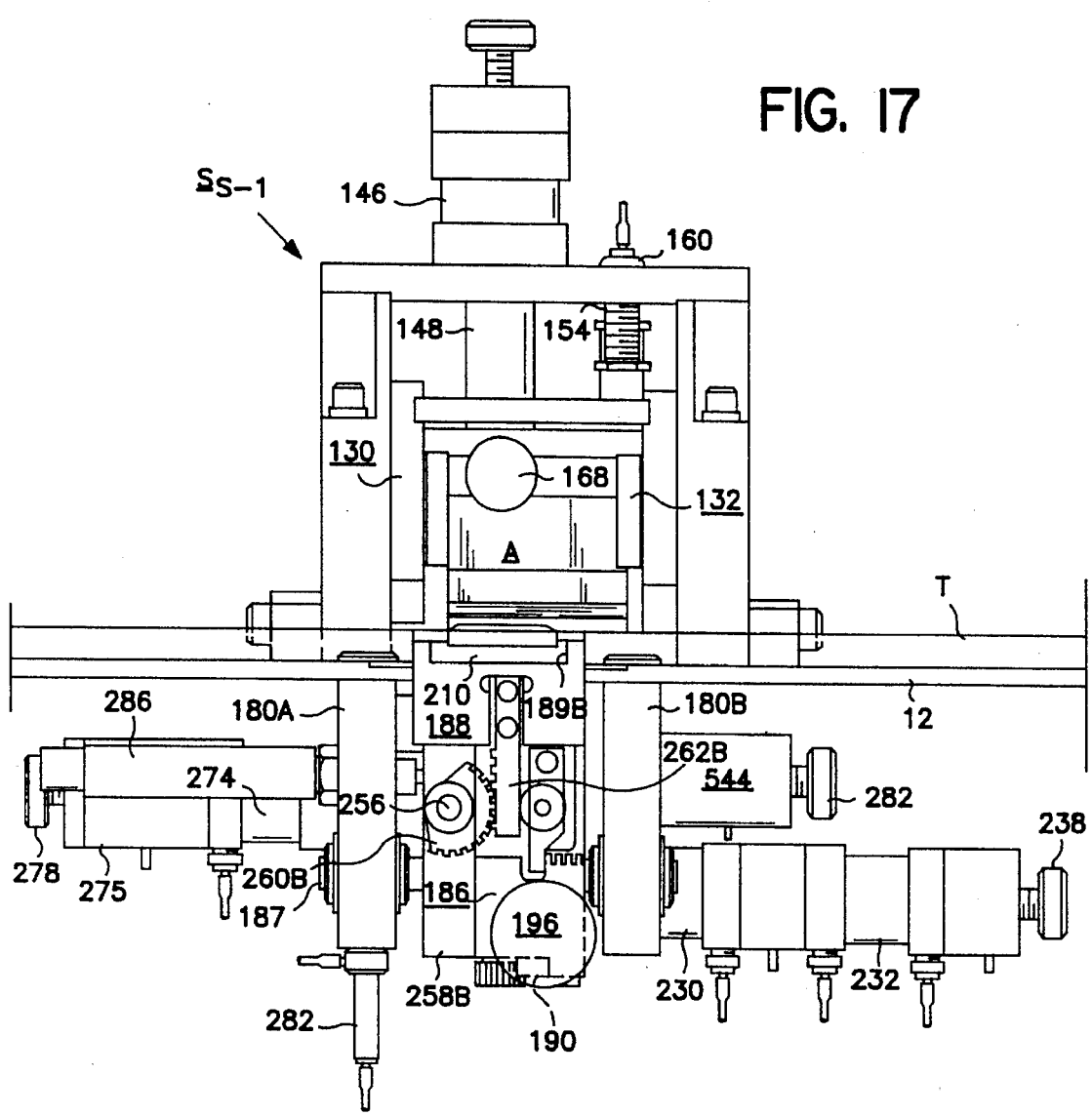
FIG. 17 is a front sectional elevational view taken on lines 17—17 of FIG. 14.

As described previously during the straightening cycle, the combs 214 are moved upwardly from their lower limit position shown in FIG. 6G and a mechanism for displacing the comb assemblies C upwardly is provided, the details of which are best shown in FIGS. 14, 17 and 23. As shown therein, the central block 186 mounts a series of air cylinders 230 and 232 including sensing means 232$^b$ and 238$^a$ for adjusting the actuator of the air cylinder and in turn fine tuning the up and down movement and limit positions of the comb assembly carriages. The comb carriage block 188 and associated combs C are moved upwardly from their lower limit position in a two step sequence. With reference to FIG. 23, the two ended actuator 252 of air cylinder 230 moves to the right until its rearwardly extending portion 252$^a$ contacts the front face of air cylinder 232 and its actuator 232$^a$. The leading end of actuator 232$^a$ is equipped with a pitot air supplied port 232$^b$ defining sensing means. When the actuator 252 closes off port 232$^b$ of actuator 232$^a$, the upward movement of the comb carriage is stopped. This is the 1/2 up position of the combs as illustrated in FIG. 6I and a dwell occurs at this point. The actuator 232$^a$ of air cylinder 232 is then moved to the right until its rear extension 232$^b$ confronts an adjustable stop 238, including a pitot air supplied port 238$^a$ sensing means providing an adjustable full up position for the combs. As the actuator 232$^a$ moves to the right, the port 232$^b$ is again opened and the actuator 252 will move to the right until the actuator 252 again closes off the port 232$^b$ of actuator 232$^a$. This is the full up position of the combs C. The actuator 252 pivotly mounts a link 254 fixed to a torsion shaft 256 being supported in blocks 258$^a$ and 258$^b$. The shaft 256 mounts quadrant gears 260$^a$ and 260B at its outer terminal ends which mesh with tooth racks 262$^a$ and 262$^b$ connected to the comb carriage 188. Accordingly, displacement of the actuator 252 linerally effects rotation of the link 254. Rotation of quadrant gears 260$^a$ and 260$^b$ moves the comb carriage block 188 and associated comb slide assemblies C up or down through meshing engagement with the racks 262$^a$ and 262$^b$.

In the later stages of the straightening cycle, the comb assemblies C are actuated inwardly toward one another at the upper limit position to engage through the spaces between the curled terminal ends of the leads L to achieve the final straightening described previously. Since the J portion of the leads L extends only a small distance beyond the plane of the bottom face of the body portion B of the PLCC part P, it is important to locate the upper limit position of the comb assemblies C precisely before moving them inwardly toward one another. To this end, an encoder 264 having a probe 266 is positioned to engage the bottom face of the comb carriage 188 and move with it during its up and down travel and is issued a probe 266 positioned to engage the bottom face of the comb carriage 188 and move with it during its up and down travel and is used to measure the vertical distance of travel from its home position, carriage down, to an adjusted up position, where the bottom of the comb teeth 216 just clears the bottom face of the PLCC P.

Encoder is a commercially available electronic measuring device when accurately measures travel and distances in 0.0001 inches in very small increments and thereby insure precise control of the movement of the comb assemblies in this critical portion of the combing cycle. (See FIG. 6J).

Now with the slide assemblies moved inwardly in the terminal portion of the combing cycle, means is provided for oscillating the comb assemblies to prevent spring back of the straight leads. This part of the cycle is shown schematically in FIG. 6K. To this end, a link 268 is bolted to the central block 186 and projects to the left in FIG. 23 to engage a pin 270 mounted on the actuator 272 of air cylinder actuator 274.

The two ended actuator air cylinder 274 has a housing 275 mounted on its rear face. Centrally located within the bore $275^a$ of the housing 275 is a pin shaft 276 having an enlarged cylindrical head $276^a$. The cylindrical head $276^a$ of the pin shaft 276 is maintained in a central position within the bore $275^a$ of the housing 275 by the opposing forces of two spring biased slidable ranged spring retainers $277^a$ and $277^b$ pressing against both faces of the cylindrical head $276^a$ of pin shaft 276 and a centralized shoulder $275^b$ in the housing 275. One ranged slidable spring retainer $277^b$ is mounted on the shaft of the cylindrical headed pin shaft 276. The other ranged slidable spring retainer is mounted on the cylindrical tip portion of a threaded adjustment screw 278.

The actuator 272 of air cylinder 274 extends through both ends of air cylinder 274. When the actuator 272 moves to the right with reference to FIG. 23, the end wall of connecting link 268 closes off the port $282^a$ of a pitot air supplied sensor $S_{44}$. The limit of travel of the central block 186, and comb carriage 188 to the right or "up track" being set by the adjustment screw 282. When the port $282^a$ is closed off, the air cylinder 274 reverses direction and actuator 272 moves to the left contacting the end of the pin shaft 276. The pin shaft 276 moves the spring retainer $277^a$ to the left along the cylindrical portion of the adjustment screw 278 until the port $277^a$ is cut off. The limit of travel of the central block 186 and comb carriage to the left or "down track" is set by the adjustment screw 278. When the port $277^c$ is closed off, the air cylinder 274 is deactivated and the actuator 272 moves to the right and the retainer $277^a$ moves the pin shaft 276 back to its normal centralized home position completing the oscillation cycle.

The air cylinder 142 for actuating anvil carriage 132 for the recurling and coplanarity reconditioning cycles is equipped with the same self-centering means just described.

When the first straightening cycle is completed, air cylinder 282 effects retraction of part locator pin 128, and with the release of the pressure on the anvil A, the PLCC part P moves by gravity out of the first Straightening Station along the trackway T gravity and passes an exit sensor $S_4$ to condition the Rotation Station to rotate the PLCC part P just exiting from the first Straightening Station $S_{s-1}$.

Another encoder 286 is mounted on block $180^a$ to electronically measure displacement of the comb carriage during the oscillating cycle.

Having conditioned the leads on the two opposing rows $R_1$ and $R_2$ of the PLCC part P means is provided downstream of the first Straightening Stations $S_{s-1}$ for rotating the PLCC part P to properly present the rows $R_3$ and $R_4$ to a second Straightening Station $S_{s-2}$. The details of the rotation assembly are best shown in FIGS. 24, 25 and 26. To this end, the face plate 12 has an elongated rectangular cut-out or opening 300 extending generally transversely of the trackway T to accommodate a turntable housing unit 302 which as illustrated in FIG. 25 is bolted to the underside of the face plate 12 and projects upwardly through the opening 300 in the manner shown in FIG. 24. The turntable assembly includes a number of elements mounted in the housing including a cap 304 having formed therein, right angularly disposed channels $306^a$ and $306^b$ generally of the same width as the trackway T removably mounted on a rotable disc like base or a bore 305. The striker plate 310 is mounted for reciprocating movement and has a tip portion slideably engaging in channels $306^a$ and $306^b$. The striker plate 310 as illustrated in FIGS. 24 and 25, is mounted on a sliding block 312 by means of a screw $312^a$. The sliding block 312 is contained and slidably mounted in a cavity 314 of the housing 304. The sliding block 312 carries a bracket 316 on its leading edge connecting it to a coupling $316^a$ of air cylinder 320. As shown in FIG. 24 the in and out travel distance of the striker plate 310 is reference S.

As illustrated in FIG. 25, the trackway T is interrupted to define a circular pocket for the turntable mechanism. Actuating means is provided for selectively rotating the turntable 304. To this end, the base 305 mounts a stubshaft 322 on its lower face rotatably journaled in bearings 324. The stubshaft 322 mounts a drive pulley 326 connected to an air operated rotary actuator 328 by timing belt 330 and pulley 332. Means is provided for asserting a predetermined light pressure on the PLCC part P during the rotational sequence. The mechanism for doing this is best illustrated in FIGS. 24 and 25 and includes an upstanding bracket 334, which pivotally mounts an arm 336 which in turn houses at its outer terminal, an air operated hold down pin 332. As shown in FIG. 25, the arm 336 is generally "T" shaped in plan, the outer extremities of the cross bar having two sensors $S_{20}$ and $S_{21}$. These sensors are conventional light activated units, in this case consisting of detectors mounted in the arm 336 and aligned emitters mounted on the housing 302.

In a typical cycle of operation a PLCC part P moving down the trackway T, first intercepts the sensor $S_{21}$ to signal the central logic system that a PLCC part P has entered the turntable 304 and is positioned centrally of the turntable as shown in FIG. 26. Hold down pin 338 is now extended to engage the lower face of the PLCC part P at its geometric center. This engagement produces a light pressure on the face. This arrangement eliminates any possibility of damage to the PLCC part P and particularly to windows which may be formed therein. It is noted that striker plate 310 is in its inner limit position (See FIG. 25) defines a passageway wide enough for the PLCC part P with the back edge of the channel $308^a$ wide enough for the PLCC part P and the conditioned leads of rows $R_1$ and $R_2$ to pass. The striker plate 310 now is retracted to its rearward limit position whereby the tip is moved to a position permitting ninety degrees (90°) rotation of the turntable 304 via the rotation mechanism including drive pulley 326, timing belt 330 and air motor 328. The turntable 304 is rotated counterclockwise precisely 90° so that the rows $R_3$ and $R_4$ are now disposed parallel to the trackway T and confront the tip portion of the striker plate 304. The striker plate 310 is then recycled so that the tip portion is engaged through channel $306^a$ to engage and press leads of $R_4$ against channel 306B and thereby achieve the initial alignment of the leads in a longitudinal direction. This permits free passage of the PLCC part P down the trackway T to the next straightening station $S_{s-2}$. After this operation, the hold down pin 338 is retracted, the striker plate 310 is again withdrawn rearwardly and now channel $306^b$ is aligned with the trackway T connecting the Rotational Station $S_r$ and the second straightening station $S_{s-2}$. The PLCC part P then moves by gravity to the next treatment station. As the PLCC part P exits the Rotation Station $S_r$, it transverses the exit sensor $S_{20}$ which initiates return of the turntable 304 to its "home position" by retracting the striker plate 310 and activating the turntable rotation mechanism including the drive pulley, timing belt and air motor. Simultaneously, the Second straightening station $S_{s-2}$ is conditioned to start a reconditioning cycle when the PLCC part P arrives at that station.

The second straightening station $S_{s-2}$ is identical in all mechanical and functional respects to the first straightening station $S_{s-1}$ described above. Accordingly, the parts are numbered with the same reference numerals as the first treatment station with the letter "A". Fully reconditioned PLCC part P exists the second straightening station $S_{s-2}$ and move down the trackway T to a Discharge Station $S_d$. The details of the Discharge Station are best shown in FIGS. 3, 27 and 28. In the present instance, the fully reconditioned PLCC part P travels down the trackway T where it is brought to a stop by a side edge of a blade 358 where the presence of the PLCC part P is detected by a sensor $S_{19}$ consisting of an emitter and detector. Sensor $S_{19}$ initiates discharge of the fully reconditioned PLCC parts P to a package in the form of an empty plastic tube 350 positioned at the discharge end of the apparatus. More specifically, the discharge mechanism 352 consists of an elongated housing 354 having a slotted trackway 356 which houses a pusher blade 358 adapted for reciprocating movement to deliver a PLCC part P at the end of the trackway T to discharge trackway $T_d$ and plastic tube 350 by means of an air cylinder 360. The pusher blade 358 is keyed at its right hand end, to a bracket 362. (See FIG. 27). The bracket 362 is secured to a rectangular block 364 and also to the actuator 366 of air cylinder 360. The block 364 is mounted on linear bearings 368 for reciprocating movement. An air sensor block 370 is adjustably mounted on the base of the housing 354. The sensor block 370 has an air port 372, axially aligned with the edge $364^a$ of the block 364. As the pusher blade 358 is actuated to the left, the edge $364^a$ of block 364 closes off the air sensing port 372 of air sensor 370 causing the air cylinder 360 to reverse stroke, retracting blade 358 to its home position as shown in the drawing. The travel distance of blade 358 moves the PLCC part P just inside the plastic tube 350.

Having now described the various components and systems of the PLCC parts P reconditioning and straightening apparatus of the present invention including a description of various of the mechanisms, the following is a brief description of an overall cycle of operation with reference to the primary components described above.

Figure 4:
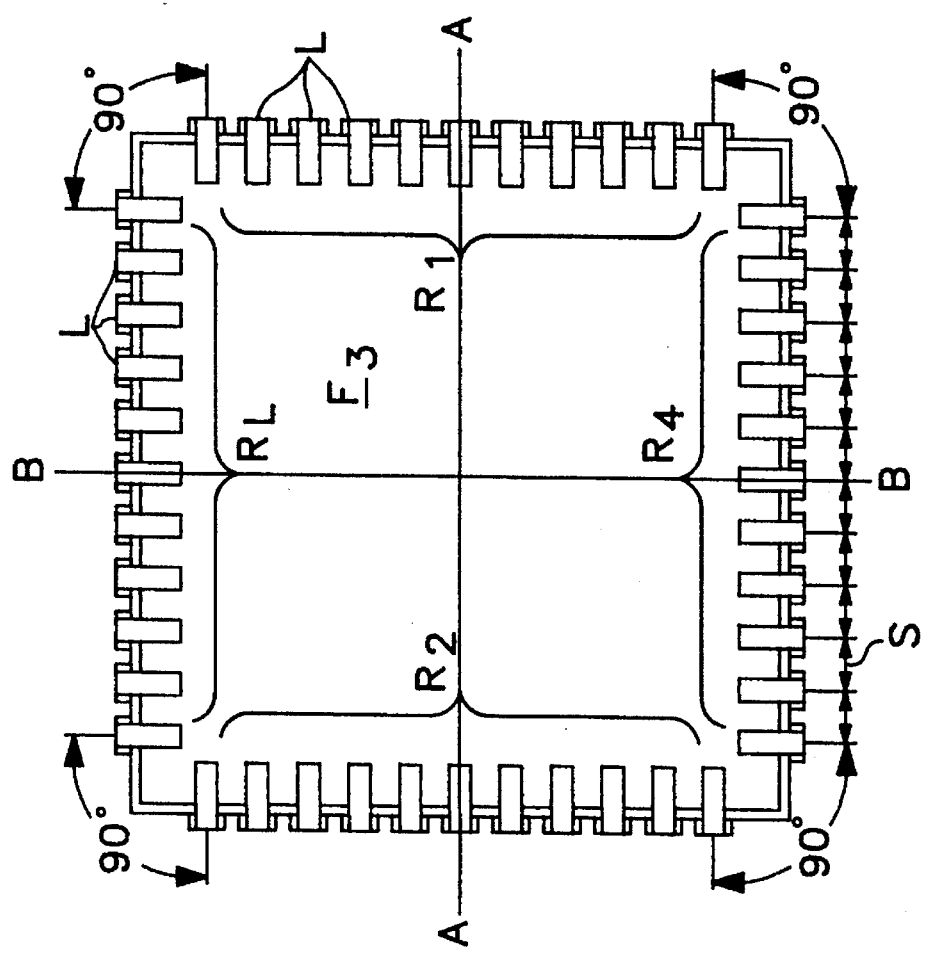
FIG. 4 is an enlarged plan view of a PLCC part having generally J-shaped leads on all four sides.

The term reconditioning as used herein broadly means placing the PLCC part P in true 100% specification and incorporates a number of operations on the leads including straightening whereby the leads ate positioned in an array where they are parallel in an axis A—A (See FIGS. 4 and 5) so that they are uniformly spaced pin to pin reference S in FIGS. 4 and 5, a peak-to-peak tolerance designated by the letter C in FIGS. 4 and 5, with respect to opposed rows, so that the apex of the curved tip portion of the lead all lie in a common plane reference P-P in FIGS. 4 and 5 and recurling the leads so that tip portion conform to a predetermined accurate shape.

PLCC parts P to be reconditioned to produce PLCC parts P within prescribed tolerances are housed in elongated packages C which are placed at the entrance end of the apparatus and gravity fed along a trackway T through various processing stations. Tubes filled with PLCC parts P to be reconditioned are stored in the hopper of an automatic feeding mechanism F shown schematically in FIG. 2 which presents filled tubes C to the entrance end of the apparatus and positions them to discharge PLCC parts P automatically. When a tube C is so positioned, the PLCC parts P discharge from the tube by gravity and pass through entrance sensors $S_1$, $S_2$ consisting of two closely spaced sensors which detect the presence of PLCC parts P which then fill the trackway T in abutting end to end relation upstream of the singulating station $S_s$. When sensors $S_1$ and $S_2$ no longer sense the presence of PLCC parts P, the automatic feeding mechanism F is cycled to present another filled tube C to the loading station. Two closely spaced sensors $S_1$ and $S_2$ insure against false signals being sent to the automatic cartridge feeding and loading mechanism.

The Singulating Station $S_s$ performs three functions, namely: (1) feeding PLCC parts P one at a time to the system (See FIGS. 7 and 8), (2) preconditioning of the leads L in opposing rows $R_1$ and $R_2$ to insure smooth flow down the trackway T and through the system (See FIGS. 3, 6, 7 and 8), and (3) conditioning the Corner Treatment Station $S_{cr}$ for a cycle of operation on a PLCC part P being delivered to the station. Sensor $S_3$ conditions the Corner Treatment Station $S_{cr}$ for operation.

When the sensor $S_8$ detects the presence of a PLCC part P at the Corner Treatment Station $S_{cr}$ and initiates the following sequence of operation. The PLCC part P is positioned bottomed side up or "dead bug" at the Corner Treatment Station $S_{cr}$ and in this position four (4) cooperatively associated dies are engaged interiorly of the rows of leads L and actuated radially outwardly (See FIG. 6D) to push leads L which are excessively bent inwardly, outwardly so that they do not project beyond the peripheral trace of a square of predetermined dimensions to accommodate the pad of the anvil A for the later lead conditioning operations. This insures against damage of leads L during the subsequent straightening operation.

PLCC parts P discharged from the from the Corner Treatment Station $S_{cr}$ pass a sensor $S_7$ to condition the first Straightening Station $S_{s-1}$ for a straightening cycle. As the PLCC part P enters the first Straightening Station $S_{s-1}$, the anvil A is lowered to hold the part in place (See FIG. 6H) and the comb assemblies C are disposed in the inward lower limit position (See FIG. 6G).

The comb assemblies C move from their "home position" shown in FIG. 6G outwardly and then upwardly through the leads L in the manner shown in FIGS. 6G, 6H and 6I to straighten the leads in two opposing rows $R_1$ and $R_2$ and achieve the proper pin to pin spacing S. Note that the root of the leads with reference to FIG. 5, is wider than the curled tipped portions and therefore the space between adjacent leads L is less. Accordingly, the anvil A exerts a light pressure on the PLCC part P during the initial stroke of the comb assemblies C through the root portion of the leads L (solid lines in FIG. 6) and the pressure on the anvil A is increased on the later part of the stroke (broken lines in FIG. 6I). The comb assemblies C move inwardly between the tip portions as shown in FIGS. 6J and 6K and are oscillated to achieve final spacing S and straightening which means disposition of the leads L parallel to the plane A—A.

Reconditioning and coplanarity of the leads L in rows $R_1$ and $R_2$ are achieved by relative movement of the anvil A with respect to the PLCC part P which is fixed by the comb assemblies C first in one direction as shown in FIG. 6L and then in an opposite direction as shown in FIG. 6M. The PLCC part P with reconditioned rows $R_1$ and $R_2$ exits the first Straightening Station $S_{s-1}$ passes sensor $S_4$ which conditions Rotation Station $S_r$. The PLCC part P enters a turntable 304. The PLCC part P is rotated 90° by turntable 304 to position rows $R_3$ and $R_4$ parallel to the trackway a striker plate 310 preconditions the leads L in row $R_3$ and $R_4$ by "squeezing" them so that the outside dimension is less then the width of the trackway and thereby insures free movement of the PLCC part P to the Second Straightening Station $S_{s-2}$. The squeezing action at the Rotational Station $S_r$ is similar to the squeezing action at the Singulating Station $S_s$ for rows $R_1$ and $R_2$.

PLCC parts P exiting the Rotational Station $S_r$ activates sensor $S_{20}$ to condition the Second Straightening Station $S_{s-2}$ for the final straightening operation. Rows $R_3$ and $R_4$ are straightened and recurled at the Second Straightening Station $S_{s-2}$ in precisely the same manner as rows $R_1$ and $R_2$ at the First Straightening Station $S_{s-1}$.

PLCC parts P exiting the Second Straightening Stations $S_{s-2}$ activate a sensor S19 to condition the single tube loading mechanism at the Discharge Station $S_d$. (See FIGS. 27 and 28).

Even though particular embodiments of the present invention have been illustrated and described herein, it is not intended to limit the invention and changes and modification may be made therein within the scope of the following claims.

Even though the apparatus of the present invention has been shown and described in connection with a specific PLCC part of a given size and shape, it is to be understood that the apparatus may be easily and quickly adapted to accommodate PLCC parts of different sizes and geometric configurations. For example, the trackway channel 20 can easily changed by simply moving the rails 16 and 18 either inwardly to narrow the channel or outwardly to enlarge the channel. Other components of the apparatus which are easy to replace for different sized PLCC parts include the corner treatment dies at the corner treatment station, the anvil with a pad having a given reforming recess configuration to conform to the particular type of PLCC part being processed and the turntable at the rotation station $S_r$ and its cooperatively associated striker plate. Finally, simple changes at the discharge station including a different striker plate are needed to process PLCC parts of different sizes and shapes. As is apparent, the apparatus can be quickly and easily converted because there are only a few change parts needed and the design is such that they are easily and readily accessible for change or adjustment.

Even though the present invention has been illustrated and described in connection with a PLCC part of generally square configuration, it is to be understood that the apparatus, system and method of the present invention have application to plural sided PLCC parts which comprise opposing generally parallel rows of leads. For example, the system and method can be easily adapted to a six sided PLCC part by simply adding an additional rotation and straightening station.

What is claimed is:

1. A method for reforming leads of a device having a plurality of generally straight sides and rows of leads of J-shaped configuration extending from the sides of the body portion consisting of the steps of:

displacing grossly bent inwardly displaced leads outwardly;

reforming the leads of a pair of first opposing rows of leads at a first reforming station by moving combs of a lead straightening mechanism through the leads to space the leads a predetermined distance relative to one another;

engaging the leads of one row against reforming surfaces with the combs engaging between the J-shaped terminal ends;

relocating the device to present a second pair of opposing rows of leads to a lead straightening mechanism;

reforming leads of a second opposing parallel rows of leads by moving combs through the leads to space the leads a predetermined distance relative to one another; and engaging the leads of one row against reforming surfaces with the combs engaging between the J-shaped terminal ends.

2. A method as claimed in claim 1, including the step of applying a light pressure against the leads during the reforming operation by an anvil having the reforming surfaces and displacing the anvil first in one direction relative to the anvil to reform the leads of one row and then displacing the anvil in the opposite direction to reform the leads in the opposing row of leads.

3. A method as claimed in claim 2, including the step of increasing the pressure exerted by the anvil during the later stages of the reforming step.

4. A method as claimed in claim 1, including the step of displacing the second pair of opposing rows of leads inwardly during the relocating step to insure free flow of the device along a trackway to the stations downstream of the relocation stations.

5. A method as claimed in claim 1 including the step of engaging interiorly of the J-shaped terminal end portions of the leads and displacing any inwardly leads outwardly to define an unobstructed geometric area inboard of the leads for unobstructed engagement by an anvil at the first reforming station.

6. In a system for restraightening and reforming leads of a PLCC part:

an elongated trackway having entrance and discharge ends;

a first reforming station along said trackway including means for supporting a PLCC part during a reforming cycle;

means including at least one comb assembly for combing and reforming leads to conform to predetermined peak-to-peak and coplanarity parameters;

a second reforming station downstream of said first reforming station including means for reforming the leads in a second pair of parallel rows of the leads to conform to a predetermined peak-to-peak and coplanarity parameters; and a rotation station intermediate said first and second reforming stations for selectively rotating the PLCC parts discharged from said first station to reposition the PLCC part to present the second pair of parallel rows of leads for reforming at the second reforming station.

7. In a system as claimed in claim 6, including singulating means for feeding one device at a time to the stations.

8. In a system as claimed in claim 7, wherein including means for exerting a laterally inwardly directed squeezing force on the opposing rows of PLCC parts at the singulating station so that the device will move freely down the trackway to the various stations downstream of the singulating station.

9. In a system as claimed in claim 6, including a corner treatment station located upstream of the first reforming station including means for displacing grossly inwardly bent leads outwardly to provide a space interiorly of the leads for the engagement of an anvil at the reforming stations.

10. In a system as claimed in claim 9 wherein said means for displacing grossly inwardly bent leads comprises four generally square dies actuatable from an inner nested position smaller than the predetermined space interiorly of the leads to an outer position defining an area accommodating the anvil.

11. Apparatus for reforming and recurling leads of a PLCC part having a body portion and at least two opposing parallel rows of leads extending from the body portion having curled generally J-shaped terminal ends comprising:

an elongated trackway having an entrance and a discharge end;

an anvil overlying the trackway having reforming pockets for reforming the terminal ends of the leads;

at least one comb assembly, having combs for registering between leads of the PLCC part disposed adjacent said trackway and selectively actuatable from a home position through a combing cycle to space the adjacent leads;

means for moving the PLCC part and anvil relative to one another to thereby effect engagement of all of the leads with reforming surfaces in the anvil; and rotation means for selectively rotating the PLCC parts to reposition the PLCC part to present a second parallel row of leads for restraightening and reforming.

12. A method for reforming leads of a device having a plurality of generally straight sides and rows of leads of J-shaped configuration extending from the sides of the body portion comprising the steps of:

displacing grossly bent inwardly displaced leads outwardly; and reforming the leads of a device by moving combs of a lead straightening mechanism through leads and relocating device to provide a pair of opposing rows of leads to the lead straightening mechanism.

13. In a system for restraightening and reforming leads of a device having a plurality of generally straight sides and rows of leads of J-shaped configuration extending from the sides of the body portion, means for displacing grossly bent inwardly displaced leads outwardly;

reforming means including at least one comb assembly for combing and reforming leads to conform to predetermined peak-to-peak and coplanarity parameters; and means for selectively presenting parallel opposing rows of leads to said reforming means.

* * * * *